(12) United States Patent
Sadovnikov et al.

(10) Patent No.: US 11,588,019 B2
(45) Date of Patent: Feb. 21, 2023

(54) BIPOLAR JUNCTION TRANSISTOR WITH CONSTRICTED COLLECTOR REGION HAVING HIGH GAIN AND EARLY VOLTAGE PRODUCT

(71) Applicant: Texas Instruments Incorporated, Dallas, TX (US)

(72) Inventors: Alexei Sadovnikov, Sunnyvale, CA (US); Natalia Lavrovskaya, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/540,428

(22) Filed: Dec. 2, 2021

(65) Prior Publication Data

US 2022/0093737 A1 Mar. 24, 2022

Related U.S. Application Data

(62) Division of application No. 16/781,674, filed on Feb. 4, 2020, now Pat. No. 11,217,665.

(51) Int. Cl.

| | |
|---|---|
| *H01L 29/08* | (2006.01) |
| *H01L 21/82* | (2006.01) |
| *H01L 29/732* | (2006.01) |
| *H01L 29/10* | (2006.01) |
| *H01L 29/66* | (2006.01) |
| *H01L 27/06* | (2006.01) |

(Continued)

(52) U.S. Cl.
CPC ........ *H01L 29/0821* (2013.01); *H01L 21/266* (2013.01); *H01L 21/26513* (2013.01); *H01L 21/8249* (2013.01); *H01L 27/0623* (2013.01); *H01L 29/0804* (2013.01); *H01L 29/1004* (2013.01); *H01L 29/36* (2013.01); *H01L 29/66272* (2013.01); *H01L 29/732* (2013.01)

(58) Field of Classification Search
CPC ............... H01L 29/0821; H01L 29/732; H01L 29/1004; H01L 29/0804; H01L 29/66272; H01L 27/0623; H01L 21/8249; H01L 21/26513; H01L 21/266; H01L 29/36
USPC ........................................ 257/378, 234, 309
See application file for complete search history.

(56) References Cited

U.S. PATENT DOCUMENTS

| | | |
|---|---|---|
| 4,835,596 A | 5/1989 | Werner |
| 8,946,862 B2 | 2/2015 | Lin et al. |

(Continued)

*Primary Examiner* — Sheikh Maruf
(74) *Attorney, Agent, or Firm* — Jacqueline J. Garner; Frank D. Cimino

(57) ABSTRACT

A semiconductor device includes a bipolar junction transistor having a collector, a base, and an emitter. The collector includes a current collection region, a constriction region laterally adjacent to the current collection region, and a contact region laterally adjacent to the constriction region, located opposite from the current collection region. The current collection region, the constriction region laterally, and the contact region all have the same conductivity type. The base includes a current transmission region contacting the current collection region and a constricting well laterally adjacent to, and contacting, the current transmission region and contacting the constriction region. The current transmission region and the constricting well have an opposite conductivity type than the current collection region, the constriction region laterally, and the contact region.

18 Claims, 18 Drawing Sheets

(51) Int. Cl.
  *H01L 21/8249*   (2006.01)
  *H01L 21/265*    (2006.01)
  *H01L 21/266*    (2006.01)
  *H01L 29/36*     (2006.01)

(56) References Cited

U.S. PATENT DOCUMENTS

| | | |
|---|---|---|
| 9,570,546 B2 | 2/2017 | Vanhoucke et al. |
| 9,905,679 B2 | 2/2018 | Magnee et al. |
| 2010/0032766 A1* | 2/2010 | Chen ............... H01L 29/404 257/E29.174 |
| 2010/0244143 A1* | 9/2010 | Yang ............... H01L 27/0623 257/574 |
| 2011/0101500 A1* | 5/2011 | Stenson ........... H01L 21/8222 257/592 |
| 2012/0241870 A1* | 9/2012 | Chan ............... H01L 29/66272 257/378 |
| 2012/0267720 A1* | 10/2012 | Khare ............. H01L 27/0623 257/378 |
| 2013/0277753 A1* | 10/2013 | Clark, Jr. ........ H01L 27/1203 438/234 |
| 2014/0134820 A1* | 5/2014 | Lin ................. H01L 29/6625 438/350 |
| 2014/0177330 A1 | 6/2014 | Ting et al. |
| 2014/0213024 A1 | 7/2014 | Nassar et al. |
| 2014/0367830 A1 | 12/2014 | Zhan et al. |
| 2015/0021739 A1 | 1/2015 | Chen et al. |
| 2015/0084117 A1 | 3/2015 | Bobde |
| 2015/0145005 A1* | 5/2015 | Dinh ............... H01L 29/735 257/329 |
| 2015/0155279 A1* | 6/2015 | Konrath .......... H01L 29/0804 257/77 |
| 2015/0243770 A1 | 8/2015 | Hebert et al. |
| 2016/0013177 A1 | 1/2016 | Zhan et al. |
| 2016/0197168 A1* | 7/2016 | Magnee .......... H01L 29/402 438/317 |
| 2017/0179220 A1* | 6/2017 | Koricic ........... H01L 29/0646 |
| 2018/0166536 A1* | 6/2018 | Shank ............. H01L 21/762 |
| 2019/0378833 A1* | 12/2019 | Choi ............... H01L 27/0259 |

* cited by examiner

BIPOLAR JUNCTION TRANSISTOR WITH CONSTRICTED COLLECTOR REGION HAVING HIGH GAIN AND EARLY VOLTAGE PRODUCT

CROSS-REFERENCE TO RELATED APPLICATION(S)

This application is a divisional of U.S. patent application Ser. No. 16/781,674, filed Feb. 4, 2020, which application is incorporated herein by reference in its entirety.

FIELD

This disclosure relates to the field of semiconductor devices. More particularly, but not exclusively, this disclosure relates to bipolar junction transistors in semiconductor devices.

BACKGROUND

A semiconductor device may include a bipolar junction transistor. It is generally desirable for the bipolar junction transistor to have high gain, also referred to as $h_{fe}$, and high Early voltage, also referred to as $V_A$. Attaining both high $h_{fe}$ and high $V_A$ has required additional process steps. Furthermore, known methods which may increase $h_{fe}$ (such as deeper emitter, higher base doping at the surface between emitter and base contacts, etc.) may affect the emitter and the base regions of the bipolar junction transistor.

SUMMARY

The present disclosure introduces a semiconductor device including a bipolar junction transistor. The bipolar junction transistor includes a collector with a current collection region, a constriction region laterally adjacent to the current collection region, and a contact region laterally adjacent to the constriction region, located opposite from the current collection region. The bipolar junction transistor includes a base with a current transmission region contacting the current collection region and a constricting well laterally adjacent to, and contacting, the current transmission region and contacting the constriction region.

DETAILED DESCRIPTION

Figure 1:
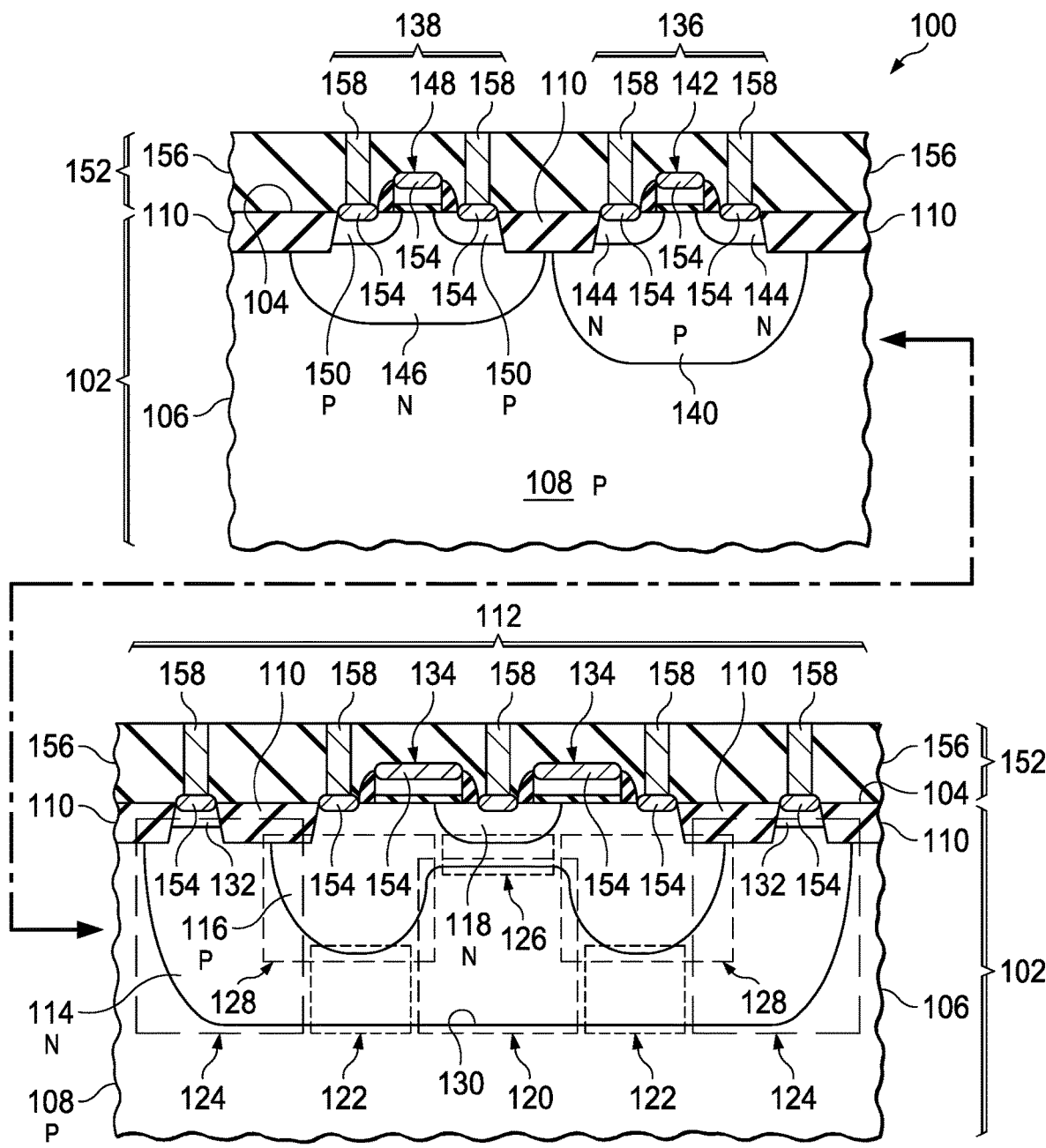
FIG. 1 is a cross section of an example semiconductor device that includes a bipolar junction transistor.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

The present disclosure introduces a semiconductor device including a bipolar junction transistor, referred to herein as the BJT. The semiconductor device has a substrate having a top surface, and a semiconductor material. The BJT includes a collector, a base, and an emitter. The collector includes a current collection region, a constriction region laterally adjacent to the current collection region, and a contact region laterally adjacent to the constriction region, located opposite from the current collection region. For the purposes of this disclosure, the terms "laterally" and "lateral" refer to directions parallel to the top surface of the substrate. The base includes a current transmission region contacting the current collection region and a constricting well laterally adjacent to, and contacting, the current transmission region and contacting the constriction region of the collector. The emitter contacts the current transmission region of the base.

During operation of the BJT, at a low collector-emitter bias, a first depletion region, located between the constricting well of the base and the constriction region of the collector, is only slightly wider than an equilibrium value, so that an impedance of the constriction region is low, and a potential of the current collection region of the collector is close to a potential of the contact region of the collector. At the low collector-emitter bias, a second depletion region, located between the current transmission region of the base and the current collection region of the collector, is similarly only slightly wider than an equilibrium value, enabling the BJT to operate at a high $h_{fe}$ determined by dopant concentrations in the current transmission region and the current collection region.

At a high collector-emitter bias, the first depletion region, between the constricting well and the constriction region, is only significantly wider than the equilibrium value, so that the constriction region is reduced in thickness, and an impedance of the constriction region is high, resulting in the potential of the current collection region being lower than the potential of the contact region, in turn resulting in the second depletion region being lower than would be the case if the potential of the current collection region were at the potential of the contact region, enabling the BJT to operate at a higher $h_{fe}$ than possible if the potential of the current collection region were at the potential of the contact region. Having the $h_{fe}$ higher at the high collector-emitter bias provides an increased $V_A$, and so a product of the $h_{fe}$ and the $V_A$, is increased.

It is noted that terms such as top, bottom, over, above, under, and below may be used in this disclosure. These terms should not be construed as limiting the position or orientation of a structure or element, but should be used to provide spatial relationship between structures or elements.

In the semiconductor industry, a well comprising the same conductivity type as the substrate is sometimes referred to as merely the substrate and not a well at all; the well carries the same polarity of charge carriers as the substrate. As used herein, however, the term "well" is intended to mean either an n-type well or a p-type well, and includes even a well that may comprise the same conductivity type as the substrate.

For the purposes of this disclosure, the term "equal" as applied to dopant concentrations in a semiconductor material may be understood as equal within fabrication tolerances used to fabricate the semiconductor device containing the semiconductor material, for example, 10 percent. The term "equal" may also be understood as equal within measurement errors that are normally encountered when measuring the dopant concentrations, for example, 20 percent.

In the text disclosing methods of forming the respective semiconductor devices, as well as in all of the Figures, the semiconductor devices will be termed the "semiconductor device 100, the semiconductor device 200, etc.," though the semiconductor devices are not yet complete semiconductor devices until some of the last stages of manufacturing described herein. This is done primarily for the convenience of the reader.

FIG. 1 is a cross section of an example semiconductor device 100 that includes a BJT 112. The semiconductor device 100 has a substrate 102 with a top surface 104. The substrate 102 includes a semiconductor material 106. In this example, the semiconductor material 106 may include a lower region 108 that is p-type, as indicated in FIG. 1. The substrate 102 may be manifested as part of a semiconductor wafer, by way of example. The semiconductor material 106 may include primarily silicon, such as found in single crystal silicon wafers or silicon epitaxial layers on single crystal silicon wafers. The semiconductor device 100 may include field oxide 110 at the top surface 104 of the substrate 102, laterally separating elements of the semiconductor device 100. The field oxide 110 may have a shallow trench isolation (STI) configuration, with steeply angled sidewalls and an oxide fill that extends to a level that is approximately coplanar with the top surface 104, as depicted in FIG. 1. Alternatively, the field oxide 110 may have a local oxidation of silicon (LOCOS) configuration, with tapered ends, referred to as birds' beaks, and a thermal oxide layer extending above the top surface 104.

In this example, the BJT 112 may be manifested as an NPN BJT. The BJT 112 includes a collector 114, which is n-type, a base 116, which is p-type, and an emitter 118, which is n-type. The collector 114 includes a current collection region 120, located in the semiconductor material 106, a constriction region 122 located in the semiconductor material 106 laterally adjacent to the current collection region 120, and a contact region 124 located in the semiconductor material 106 laterally adjacent to the constriction region 122 and located opposite from the current collection region 120. The base 116 includes a current transmission region 126 contacting the current collection region 120 of the collector 114, and a constricting well 128 located in the semiconductor material 106, laterally adjacent to the current transmission region 126, and between the top surface 104 of the substrate 102 and the constriction region 122 of the collector 114. The emitter 118 is located over the current transmission region 126 of the base 116, opposite from the current collection region 120 of the collector 114. The emitter 118, the current transmission region 126 of the base 116, and the current collection region 120 of the collector 114 may have dopant concentrations and distributions that provide a desired value of $h_{fe}$ for the BJT 112. For example, the emitter 118 may have an average concentration of n-type dopants of $1 \times 10^{18}$ cm$^{-3}$ to $1 \times 10^{20}$ cm$^{-3}$, with the n-type dopants including phosphorus, arsenic, or antimony. The current transmission region 126 of the base 116 may have an average concentration of p-type dopants of $1 \times 10^{17}$ cm$^{-3}$ to $5 \times 10^{18}$ cm$^{-3}$, with the p-type dopants including boron. The current collection region 120 of the collector 114 may have an average concentration of n-type dopants of $1 \times 10^{16}$ cm$^{-3}$ to $1 \times 10^{17}$ cm$^{-3}$, with the n-type dopants including phosphorus. Other dopant concentrations for the emitter 118, the current transmission region 126 of the base 116, and the current collection region 120 of the collector 114 are within the scope of this example. The contact region 124 of the collector 114 may have a dopant concentration similar to the dopant concentration of the current collection region 120. The constricting well 128 of the base 116 may have an average concentration of p-type dopants that is more than twice an average concentration of n-type dopants in the constriction region 122 of the collector 114, so that the constriction region 122 is depleted more than the constricting well 128 when the collector 114 is biased into a linear mode of operation. For example, the constricting well 128 may have an average concentration of p-type dopants of $5 \times 10^{16}$ cm$^{-3}$ to $5 \times 10^{17}$ cm$^{-3}$, with the p-type dopants including boron. The collector 114 may extend to a depth of 2 to 5 microns below the top surface 104. The constricting well 128 extends to a greater depth from the top surface 104 than the current transmission region 126. The constriction region 122 may have a thickness of 1 micron to 2 microns, for example. A bottom surface 130 of the collector 114 may be flat across the contact region 124, the constriction region 122, and the current collection region 120. That is, the contact region 124, the constriction region 122, and the current collection region 120 extend to a same depth in the semiconductor material 106 below the top surface 104.

The BJT 112 may also include contact layers 132, that are heavily doped with the same conductivity type as the collector 114, in the contact region 124, extending to the top surface 104 of the substrate 102. The contact layers 132 may advantageously provide low resistance electrical connections to the collector 114. The BJT 112 of this example may further include a BJT gate structure 134 over the top surface 104, partially overlapping the emitter 118 and the base 116.

In this example, the semiconductor device 100 may include a first metal oxide semiconductor (MOS) transistor 136 and a second MOS transistor 138. In this example, the first MOS transistor 136 may be manifested as an n-channel metal oxide semiconductor (NMOS) transistor 136 and the second MOS transistor 138 may be manifested as a p-channel metal oxide semiconductor (PMOS) transistor 138. The NMOS transistor 136 is located in a first well 140 in the semiconductor material 106 of the substrate 102. The first well 140 is separate from the constricting well 128. In this example, in which the first MOS transistor 136 is manifested as the NMOS transistor 136, the first well 140 is manifested as a p-type well 140. The p-type well 140 may have an average concentration of p-type dopants similar to the constricting well 128 of the base 116, as a result of having been formed concurrently. For the purposes of this disclosure, the term "well" encompasses the p-type well 140 that has the same conductivity type, in this case, p-type, as the lower region 108. The NMOS transistor 136 includes an NMOS gate structure 142 on the top surface 104 of the substrate 102, and n-type source/drain regions 144 in the semiconductor material 106 adjacent to the NMOS gate structure 142.

The PMOS transistor 138 is located in an n-type well 146 in the semiconductor material 106 of the substrate 102. The PMOS transistor 138 includes a PMOS gate structure 148 on the top surface 104 of the substrate 102, and p-type source/drain regions 150 in the semiconductor material 106 adjacent to the PMOS gate structure 148.

The semiconductor device 100 may include an interconnect region 152 over the top surface 104 of the substrate 102, with interconnection elements to provide electrical connections to the BJT 112, the NMOS transistor 136, and the PMOS transistor 138. The interconnect region 152 may include, by way of example, metal silicide 154 at the top surface 104 of the substrate 102. On the emitter 118, the base 116, the collector 114, the n-type source/drain regions 144, the p-type source/drain regions 150, the BJT gate structure 134 of the BJT 112, the NMOS gate structure 142, and the PMOS gate structure 148. The metal silicide 154 may include titanium silicide, cobalt silicide, nickel silicide, or other metal silicide. The interconnect region 152 may also include a dielectric layer 156 over the substrate 102, the BJT 112, the NMOS transistor 136, the PMOS transistor 138, and the metal silicide 154. The dielectric layer 156 may be manifested as a pre-metal dielectric (PMD) layer 156, having a PMD liner of silicon nitride, a planarized layer of silicon dioxide-based dielectric material, such as phosphosilicate glass (PSG), or borophosphosilicate glass (BPSG), or silicon dioxide formed by a high aspect ratio process (HARP) using ozone and tetraethylorthosilicate (TEOS), and a PMD cap layer of silicon nitride, silicon oxynitride, or silicon carbide nitride. The interconnect region 152 may further include contacts 158 through the dielectric layer 156 to the metal silicide 154. The contacts 158 may include a titanium-containing liner and a tungsten core, for example. The interconnect region 152 may include other interconnect elements, not shown in FIG. 1, above the dielectric layer 156, to provide electrical connections to the contacts 158.

Figure 2A:
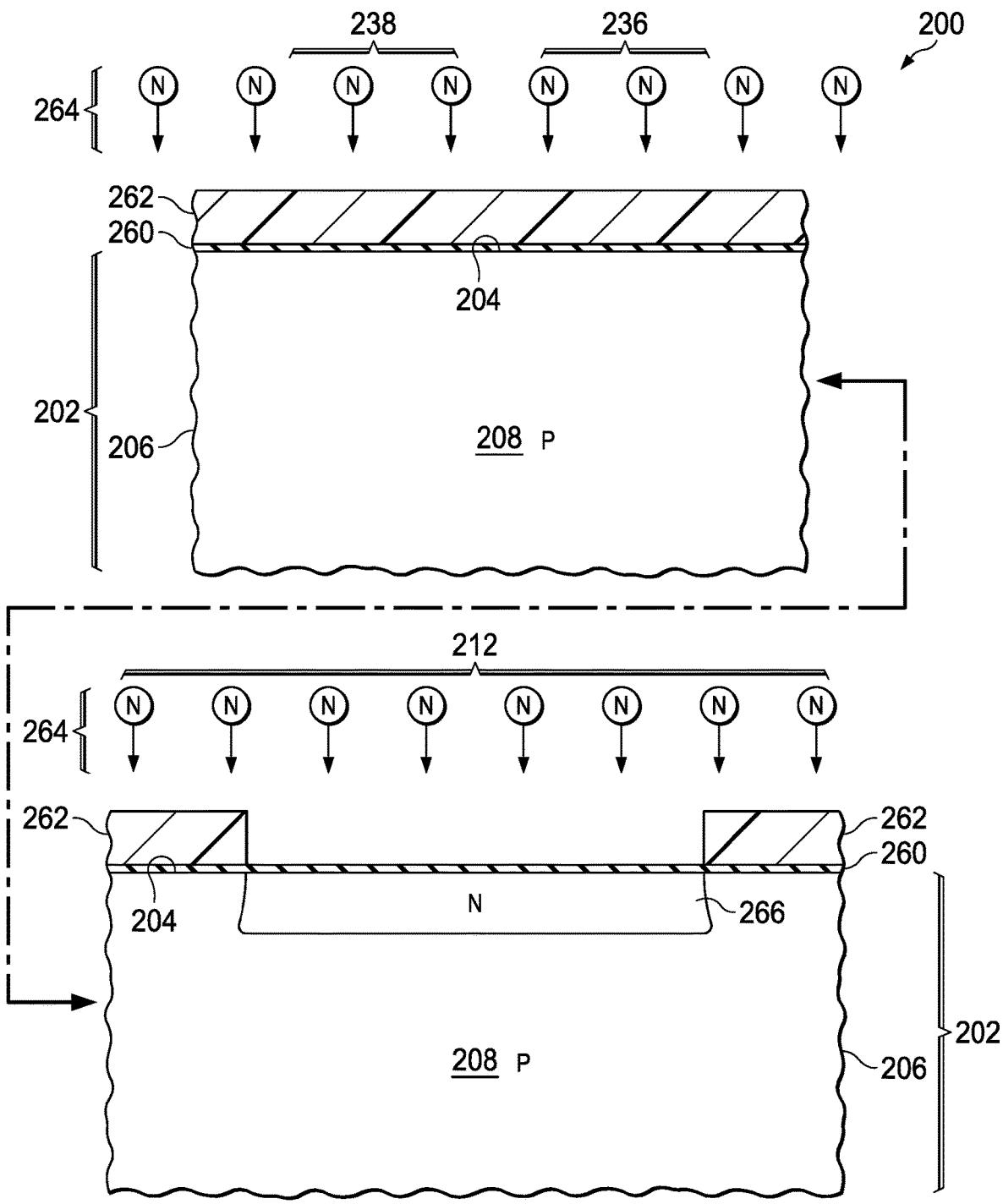
FIG. 2A through FIG. 2F are cross sections of a semiconductor device including a bipolar junction transistor, depicted in stages of an example method of formation.

FIG. 2A through FIG. 2F are cross sections of a semiconductor device 200 including a BJT 212, depicted in stages of an example method of formation. Referring to FIG. 2A, the semiconductor device 200 is formed in and on a substrate 202, which may be implemented as a semiconductor wafer. The substrate 202 has a top surface 204. The substrate 202 includes a semiconductor material 206, which may extend to the top surface 204. In this example, the semiconductor material 206 may include a lower region 208 that is p-type. The semiconductor material 206 may include primarily single crystal silicon. The substrate 202 of this example includes an area for a BJT 212, an area for an NMOS transistor 236, and an area for a PMOS transistor 238.

A first protective layer 260 may be formed on the top surface 204 of the substrate 202. The first protective layer 260 may include silicon dioxide, and may be formed by thermal oxidation of silicon in the semiconductor material 206. Other materials and methods of formation are within the scope of this example. The first protective layer 260 may be 5 nanometers to 50 nanometers thick, for example. The first protective layer 260 is sometimes referred to as a pad oxide layer.

A collector implant mask 262 is formed over the first protective layer 260. The collector implant mask 262 exposes the first protective layer 260 in an area for a collector 214, shown in FIG. 2B, of the BJT 212. Referring back to FIG. 2A, in this example, the collector implant mask 262 may cover the areas for the NMOS transistor 236 or the PMOS transistor 238. The collector implant mask 262 may include photoresist, and may be formed by a photolithographic process. Alternatively, the collector implant mask 262 may include hard mask materials such as silicon dioxide or silicon nitride, due to high implant energies used, and may be formed by a patterned etch process.

N-type dopants 264 are implanted into the substrate 202 where exposed by the collector implant mask 262 to form a collector implanted region 266 in the semiconductor material 206. The n-type dopants 264 may include phosphorus, with a total dose of $1 \times 10^{12}$ per square centimeter ($cm^{-2}$) to $1 \times 10^{13}$ $cm^{-2}$, and may be implanted at one or more implant energies up to 4 mega-electron volts (MeV).

The collector implant mask 262 may be subsequently removed. Photoresist in the collector implant mask 262 may be removed by an oxygen plasma process followed by a wet etch using an aqueous mixture of sulfuric acid and hydrogen peroxide. Silicon dioxide in the collector implant mask 262 may be removed by a wet etch using a buffered aqueous solution of hydrofluoric acid. Silicon nitride in the collector implant mask 262 may be removed by a plasma etch using fluorine radicals.

Figure 2B:
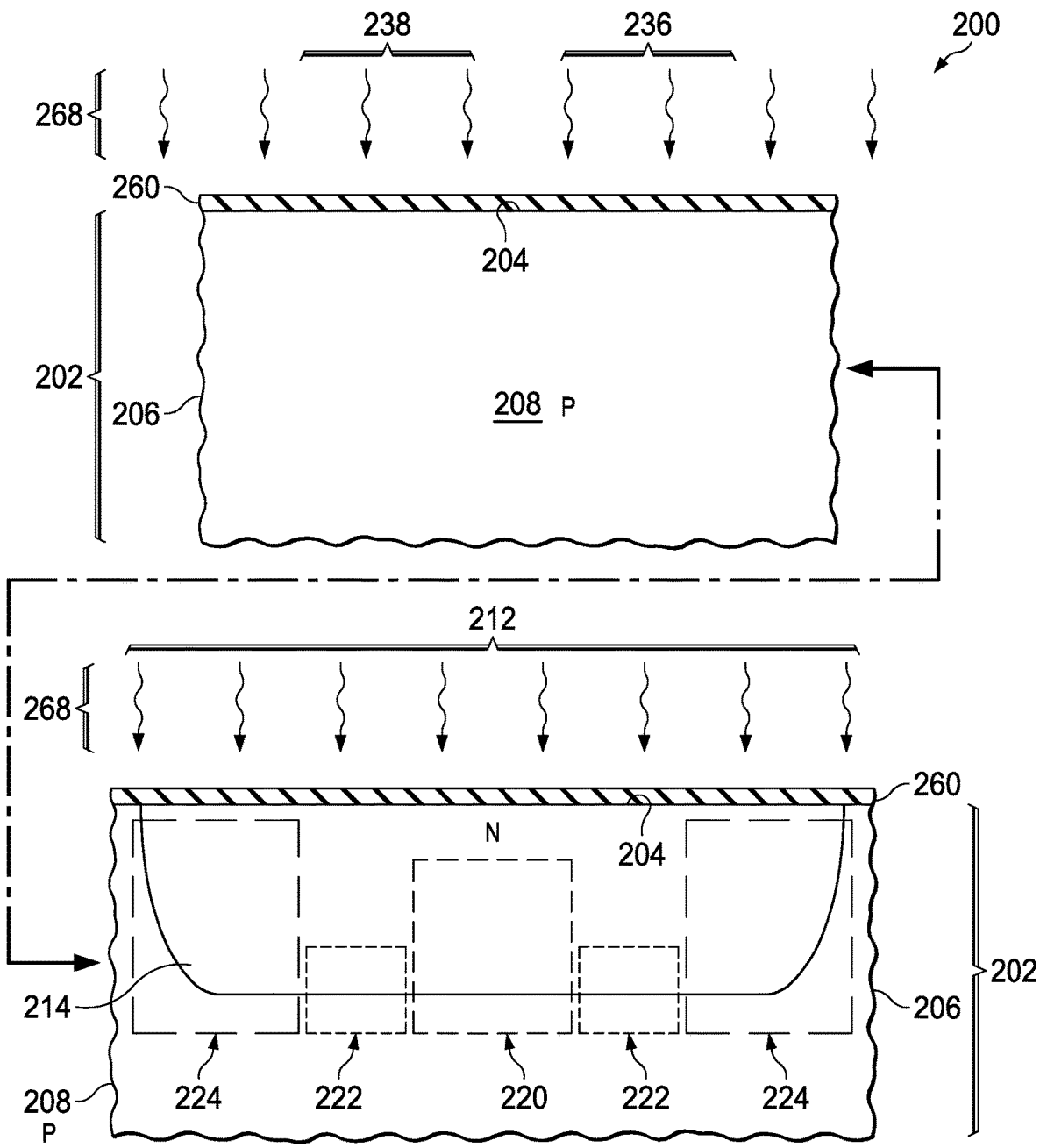

Referring to FIG. 2B, the substrate 202 is heated by an first anneal process 268, which causes the implanted n-type dopants 264 of FIG. 2A to diffuse into the semiconductor material 206 and become activated, to form the collector 214 of the BJT 212. The first anneal process 268 may be implemented as a furnace process with some oxygen in an ambient, causing the first protective layer 260 to increase in thickness. The collector 214 includes a current collection region 220, located in the semiconductor material 206, a constriction region 222 located in the semiconductor material 206 laterally adjacent to the current collection region 220, and a contact region 224 located in the semiconductor material 206 laterally adjacent to the constriction region 222 and located opposite from the current collection region 220. The collector 214 may have an average concentration of the n-type dopants 264 of $1 \times 10^{16}$ $cm^{-3}$ to $1 \times 10^{17}$ $cm^{-3}$, by way of example. Concentrations of the n-type dopants 264 in the current collection region 220, the constriction region 222, and the contact region 224 may be equal, notwithstanding decreasing concentration profiles around a boundary of the collector 214.

A portion or all of the first protective layer 260 may optionally be removed after the first anneal process 268 is completed. Silicon dioxide in the first protective layer 260 may be removed by a wet etch using a buffered aqueous solution of hydrofluoric acid.

Figure 2C:
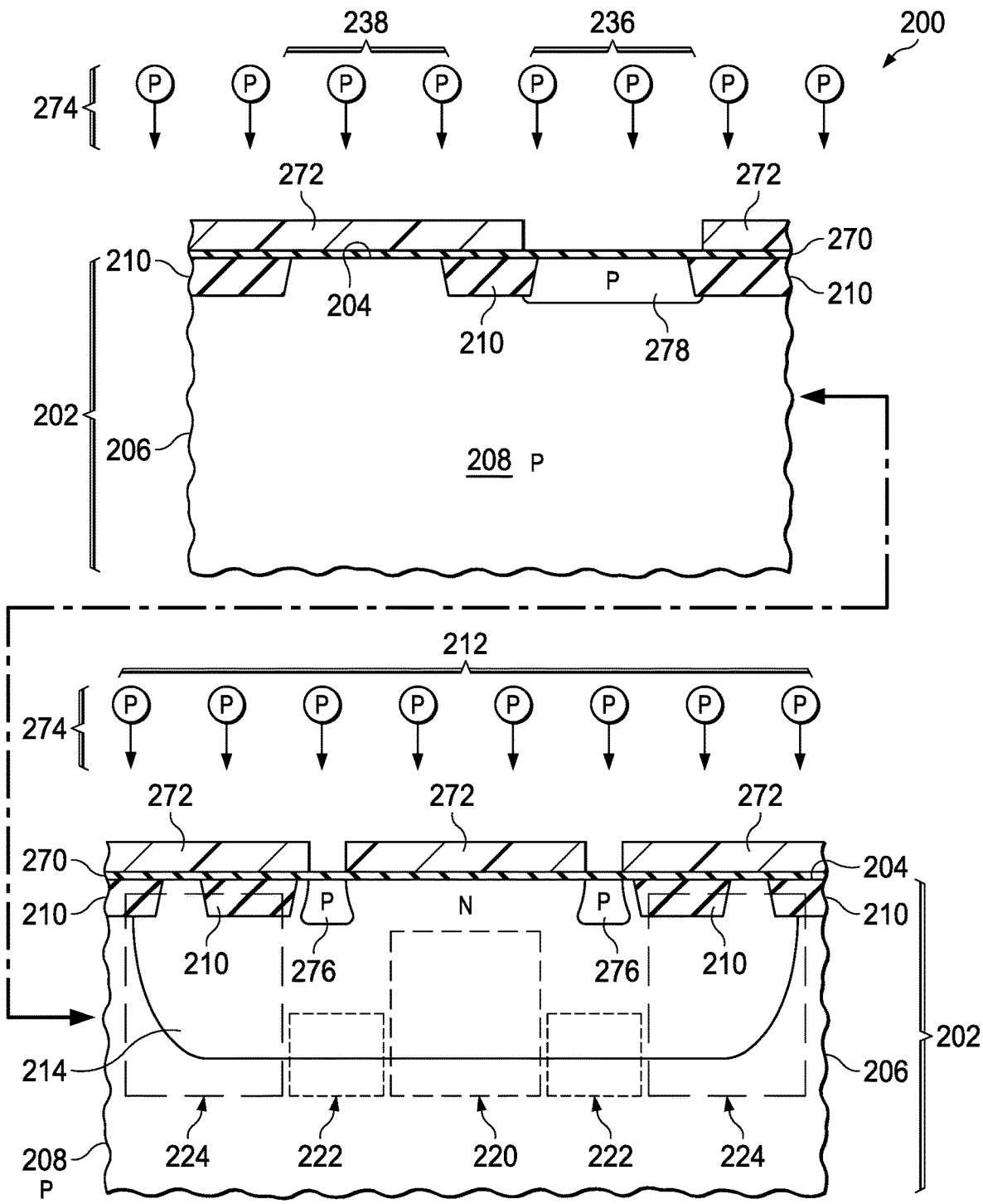

Referring to FIG. 2C, field oxide 210 may be formed in the substrate 202 at the top surface 204. The field oxide 210 may be formed by an STI process, which includes etching a trench in the semiconductor material 206 in areas for the field oxide 210 and forming a layer of silicon dioxide in the trench and over the top surface 204. The silicon dioxide is subsequently removed from outside the trench by an oxide chemical mechanical polish (CMP) process or an etch back process. Alternatively, the field oxide 210 may be formed by a LOCOS process, which includes patterning a silicon nitride layer over the top surface to expose areas for the field oxide 210. The field oxide 210 is formed by thermal oxidation of silicon in the semiconductor material 206 where exposed by the patterned silicon nitride layer. The silicon nitride layer may be subsequently removed. A second protective layer 270 may be formed on the top surface 204 of the substrate 202. The second protective layer 270 may include similar materials to the first protective layer 260 of FIG. 2A, and may be formed by a similar process.

Figure 2D:
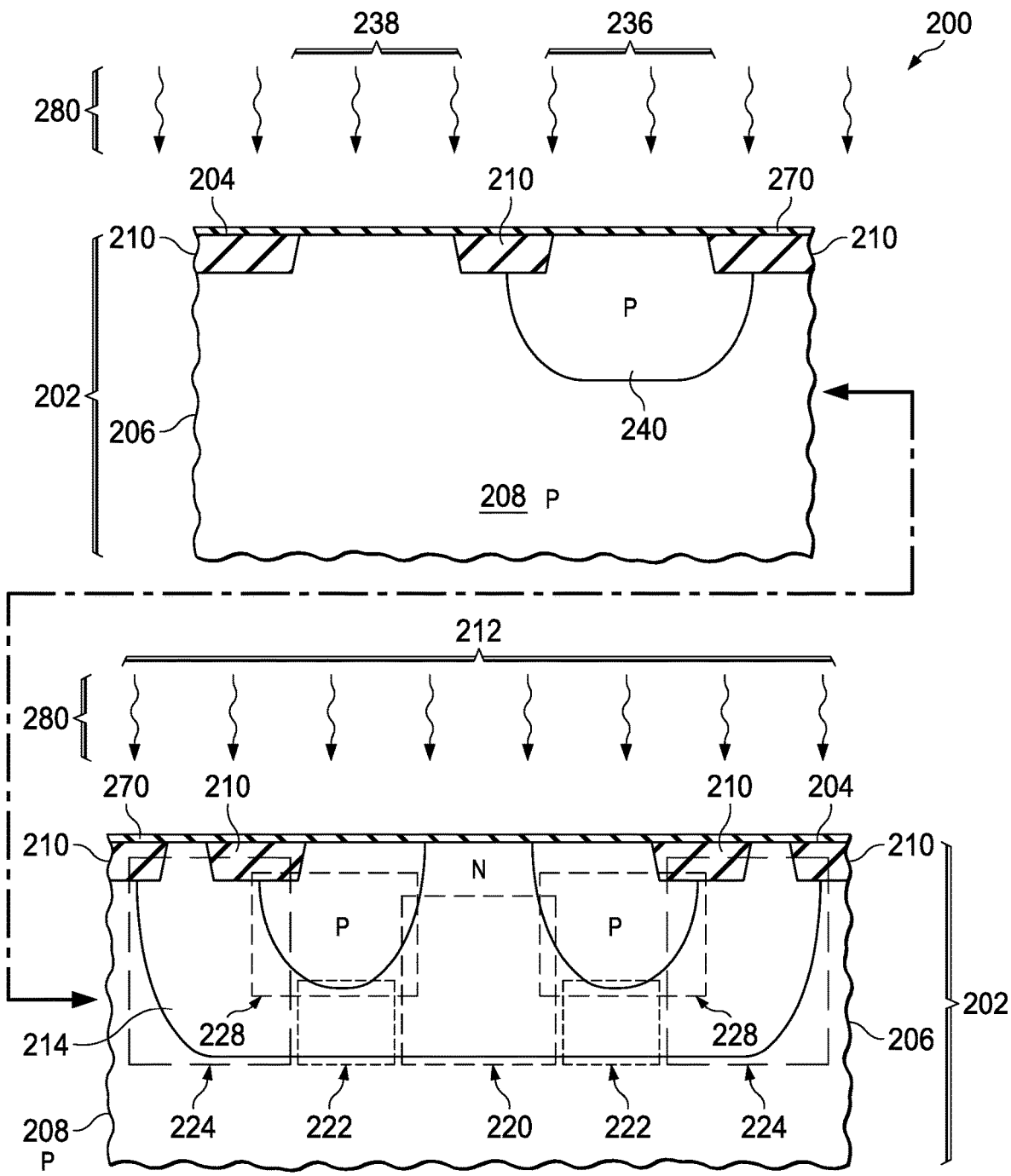

A well implant mask 272 is formed over the second protective layer 270, exposing the second protective layer 270 in an area for a p-type well 240, shown in FIG. 2D, and an area for a constricting well 228, also shown in FIG. 2D. The area for the p-type well 240 overlaps the area for the NMOS transistor 236, and the area for the constricting well 228 is located in the area for the BJT 212. In some versions of this example, the well implant mask 272 may include photoresist, and may be formed by a photolithographic process, due to relatively low implant energies used. The well implant mask 272 in these versions may also include anti-reflection materials, such as a bottom anti-reflection coat (BARC), to facilitate the photolithographic process. In other versions of this example, which use higher implant energies, the well implant mask 272 may include hard mask materials.

P-type dopants 274 are implanted into the substrate 202 where exposed by the well implant mask 272 to form a first well implanted region 276 in the area for the BJT 212 and to form a second well implanted region 278 in the area for the NMOS transistor 236. The p-type dopants 274 may include boron, with a total dose of $1 \times 10^{13}$ cm$^{-2}$ to $5 \times 10^{13}$ cm$^{-2}$, and may be implanted at one or more implant energies up to 1 MeV. The well implant mask 272 may be subsequently removed, for example as disclosed in reference to removal of the collector implant mask 262 of FIG. 2A. Implanting the p-type dopants 274 to concurrently form the first well implanted region 276 and the second well implanted region 278 may advantageously reduce a fabrication cost of the semiconductor device 200 compared to forming the first well implanted region 276 and the second well implanted region 278 separately.

Figure 2E:
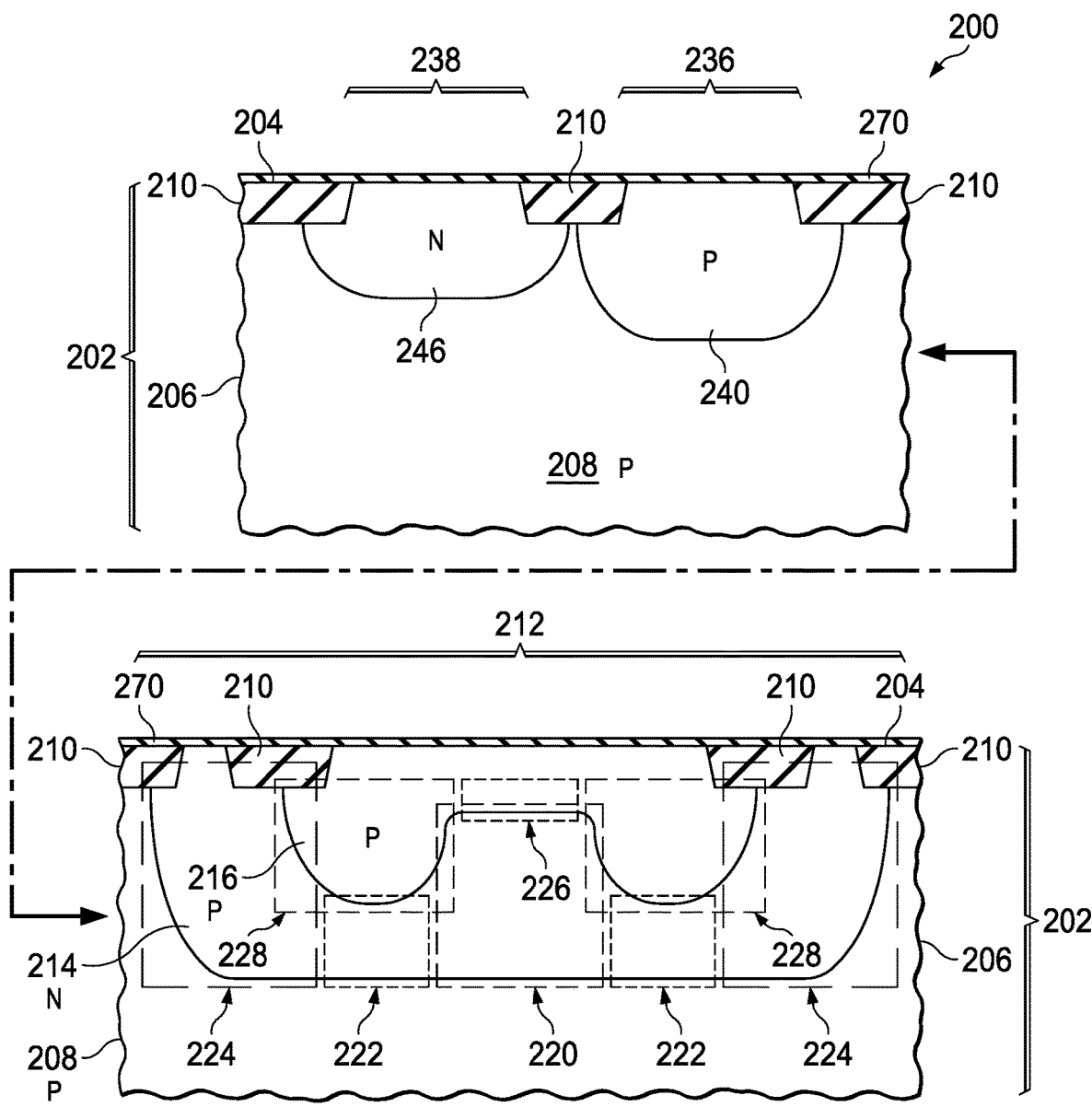
Figure 2F:
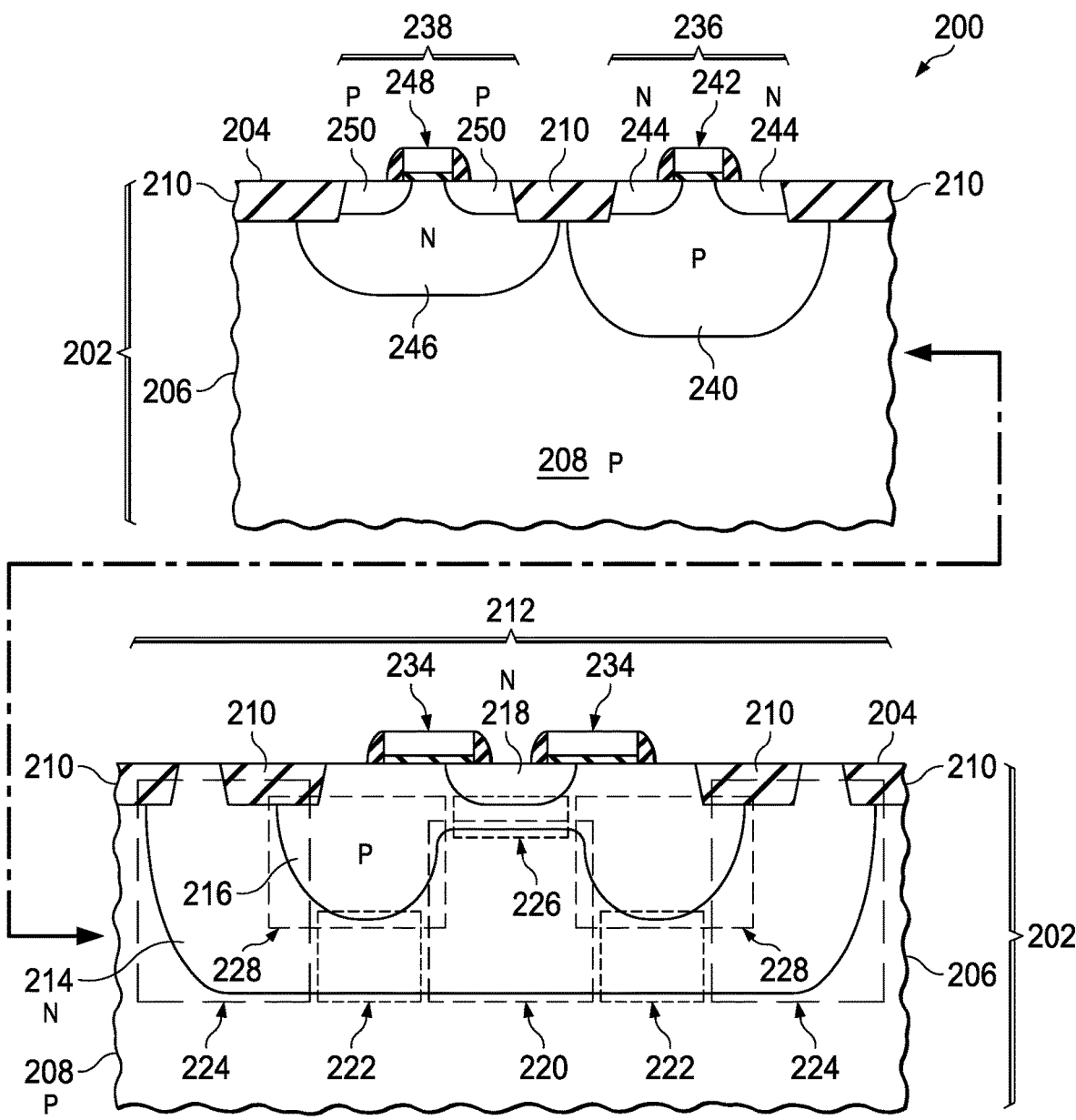

Referring to FIG. 2D, the substrate 202 is heated by a second anneal process 280, which causes the implanted p-type dopants 274 in the first well implanted region 276 of FIG. 2C to diffuse into the semiconductor material 206 and become activated, to form the constricting well 228 of a base 216, shown in FIG. 2E, of the BJT 212, and which causes the implanted p-type dopants 274 in the second well implanted region 278 of FIG. 2C to diffuse into the semiconductor material 206 and become activated, to form the p-type well 240 under the area for the NMOS transistor 236, shown in FIG. 2F. The second anneal process 280 may be implemented as a rapid thermal process, which may heat the substrate 202 above 1100° C. for 30 seconds to 60 seconds, for example.

The constricting well 228 and the p-type well 240 may have an average concentration of the p-type dopants 274 of $5 \times 10^{16}$ cm$^{-3}$ to $3 \times 10^{17}$ cm$^{-3}$, by way of example. Average concentrations of the p-type dopants 274 in the constricting well 228 and the p-type well 240 may be equal, as a result of being formed concurrently.

Referring to FIG. 2E, a current transmission region 226 of the base 216 of the BJT 212 is formed in the semiconductor material 206, laterally adjacent to, and contacting, the constricting well 228. The current transmission region 226 does not extend as far below the top surface 204 into the semiconductor material 206 as the constricting well 228. An average dopant concentration of p-type dopants in the current transmission region 226 may be different from the average dopant concentration of p-type dopants in the constricting well 228. The current transmission region 226 may be formed by implanting the p-type dopants into the semiconductor material 206, followed by an anneal process.

An n-type well 246 is formed in the semiconductor material 206, overlapping the area for the PMOS transistor 238. The n-type well 246 may be formed by implanting n-type dopants into the semiconductor material 206, followed by an anneal process.

Referring to FIG. 2F, a BJT gate structure 234 of the BJT 212, an NMOS gate structure 242 of the NMOS transistor 236, and a PMOS gate structure 248 of the PMOS transistor 238 are formed concurrently over the top surface 204 of the substrate 202. The BJT gate structure 234, the NMOS gate structure 242, and the PMOS gate structure 248 may be formed by patterning a layer of gate material such as polycrystalline silicon, commonly referred to as polysilicon, on a gate dielectric layer, followed by forming sidewall spacers of dielectric material on lateral surfaces of the patterned gate material.

An emitter 218 of the BJT 212 is formed by implanting n-type dopants, such as phosphorus and arsenic, into the current transmission region 226, followed by annealing the substrate 202. N-type source/drain regions 244 of the NMOS transistor 236 are formed by implanting n-type dopants into the p-type well 240 adjacent to the NMOS gate structure 242, followed by annealing the substrate 202. The n-type source/drain regions 244 may optionally be formed concurrently with the emitter 218. P-type source/drain regions 250 of the PMOS transistor 238 are formed by implanting p-type dopants, such as boron, into the n-type well 246 adjacent to the PMOS gate structure 248, followed by annealing the substrate 202. Formation of the semiconductor device 200 is continued by forming an interconnect region, not shown in FIG. 2F, over the top surface 204 of the substrate 202.

Figure 3:
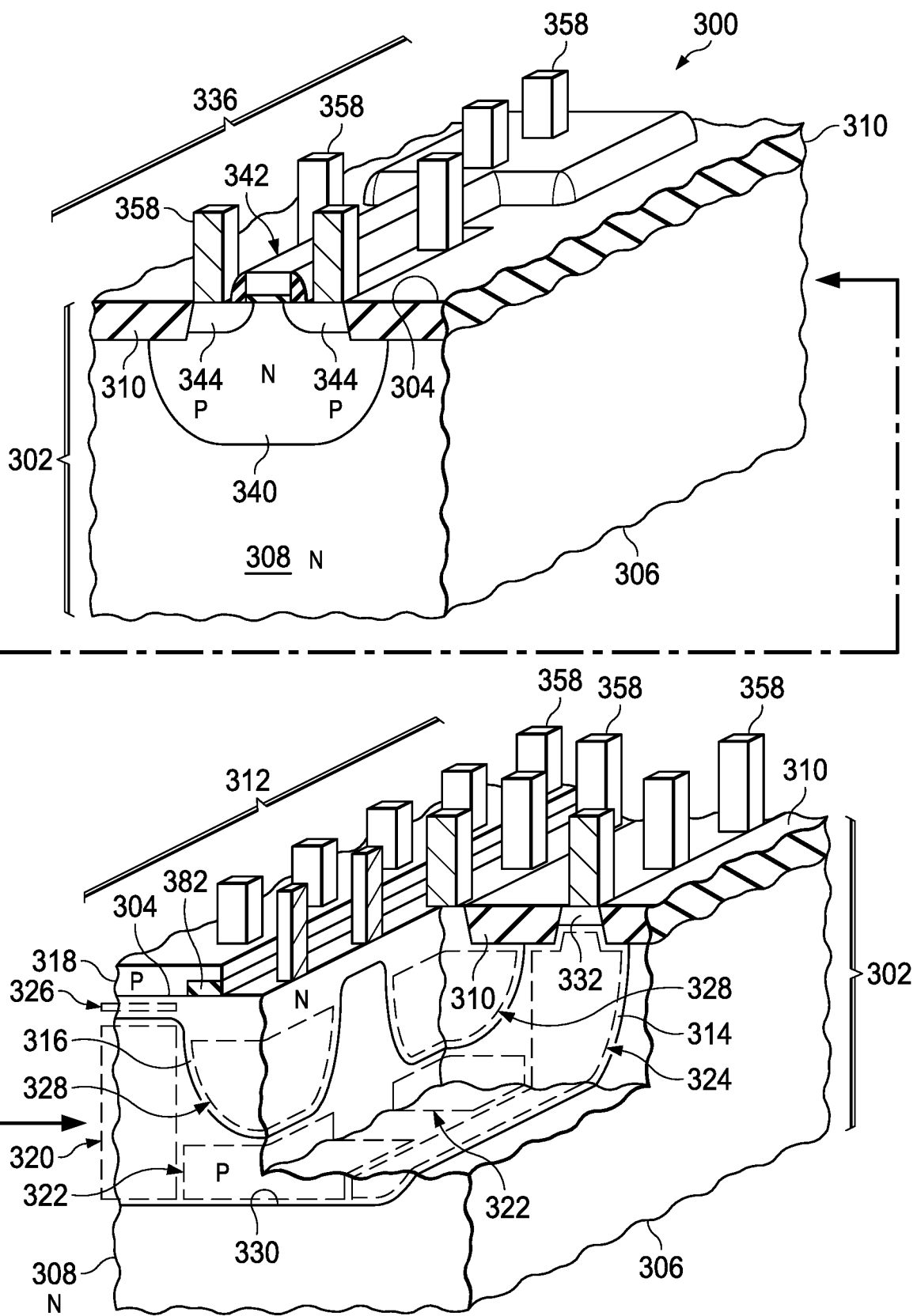
FIG. 3 is a cross section of another example semiconductor device that includes a bipolar junction transistor.

FIG. 3 is a cross section of another example semiconductor device 300 that includes a BJT 312. The semiconductor device 300 has a substrate 302 with a top surface 304. The substrate 302 includes a semiconductor material 306, which may include a lower region 308 that is n-type, in this example, as indicated in FIG. 3. The semiconductor device 300 may include field oxide 310 at the top surface 304 of the substrate 302.

In this example, the BJT 312 may be manifested as a PNP BJT. The BJT 312 includes a collector 314, which is p-type, a base 316, which is n-type, and an emitter 318, which is p-type. The collector 314 includes a current collection region 320, located in the semiconductor material 306, a constriction region 322, which is segmented in this example, as depicted in FIG. 3, located in the semiconductor material 306 laterally adjacent to the current collection region 320, and a contact region 324 located in the semiconductor material 306 laterally adjacent to the constriction region 322 and located opposite from the current collection region 320. The base 316 includes a current transmission region 326 contacting the current collection region 320 of the collector 314, and a constricting well 328, which is segmented, that is, includes multiple segments in parallel, in this example, also as depicted in FIG. 3, located in the semiconductor material 306, laterally adjacent to the current transmission region 326. Segments of the constricting well 328 are located between the top surface 304 of the substrate 302 and segments of the constriction region 322 of the collector 314. The emitter 318 is located over the current transmission region 326 of the base 316. In this example, the emitter 318 may be manifested as a polysilicon emitter 318 located on the top surface 304 of the substrate 302. The emitter 318 may be separated from the base 316 outside of the current transmission region 326 by a spacer 382 of silicon dioxide or other electrically non-conductive material.

The emitter 318, the current transmission region 326 of the base 316, and the current collection region 320 of the collector 314 may have dopant concentrations and distributions as disclosed in reference to FIG. 1, that provide a desired value of $h_{fe}$ for the BJT 312. Other dopant concentrations for the emitter 318, the current transmission region 326 of the base 316, and the current collection region 320 of the collector 314 are within the scope of this example. The contact region 324 of the collector 314 may have a dopant concentration similar to the dopant concentration of the current collection region 320. The constricting well 328 may have an average concentration and a distribution of dopants that provide a desired depletion region in the constriction region 322 when the collector 314 is biased into a linear mode of operation. The segmented configuration of the constriction region 322 and the constricting well 328 may advantageously provide a desired impedance between the current collection region 320 during operation of the BJT 312, thus providing a desired value for the $V_A$ of the BJT 312, while maintaining compatibility with implant doses for the constricting well 328 used in fabrication of the semiconductor device 300. The BJT 312 may also include contact layers 332 in the contact region 324 to provide low resistance electrical connections to the collector 314. A bottom surface 330 of the collector 314 may be flat across the contact region 324, the constriction region 322, and the current collection region 320. That is, the contact region 324, the constriction region 322, and the current collection region 320 extend to a same depth in the semiconductor material 306 below the top surface 304.

In this example, the semiconductor device 300 may include a first MOS transistor 336. In this example, the first MOS transistor 336 may be manifested as a PMOS transistor 336. The PMOS transistor 336 is located in a first well 340 in the semiconductor material 306 of the substrate 302. The first well 340 is separate from the constricting well 328. In this example, in which the first MOS transistor 336 is manifested as the PMOS transistor 336, the first well 340 is manifested as an n-type well 340. The n-type well 340 may have an average concentration of n-type dopants similar to the constricting well 328 of the base 316, as a result of having been formed concurrently. The PMOS transistor 336 includes a PMOS gate structure 342 on the top surface 304 of the substrate 302, and p-type source/drain regions 344 in the semiconductor material 306 adjacent to the PMOS gate structure 342.

The semiconductor device 300 may include contacts 358 extending through a dielectric layer, not shown in FIG. 3, to provide electrical connections to the BJT 312 and the PMOS transistor 336. The dielectric layer is not shown in FIG. 3 to avoid obscuring the structures of the BJT 312 and the PMOS transistor 336. The dielectric layer may have a structure and composition similar to the dielectric layer 156 of FIG. 1. The semiconductor device 300 may include interconnects and bond pads in an interconnect region, not shown in FIG. 3, above the contacts 358.

Figure 4A:
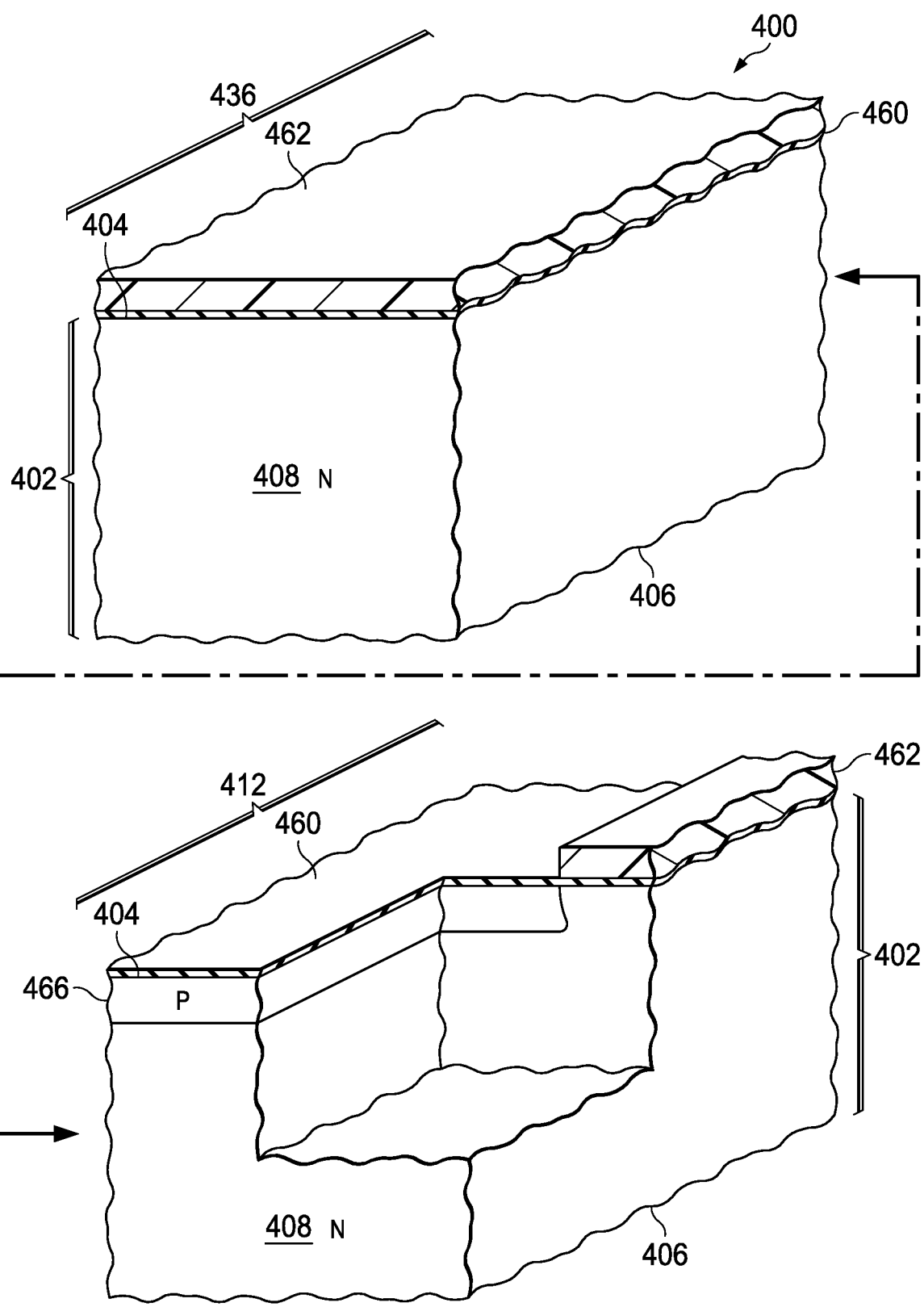
FIG. 4A through FIG. 4E are cross sections of a semiconductor device including a bipolar junction transistor, depicted in stages of another example method of formation.
Figure 4B:
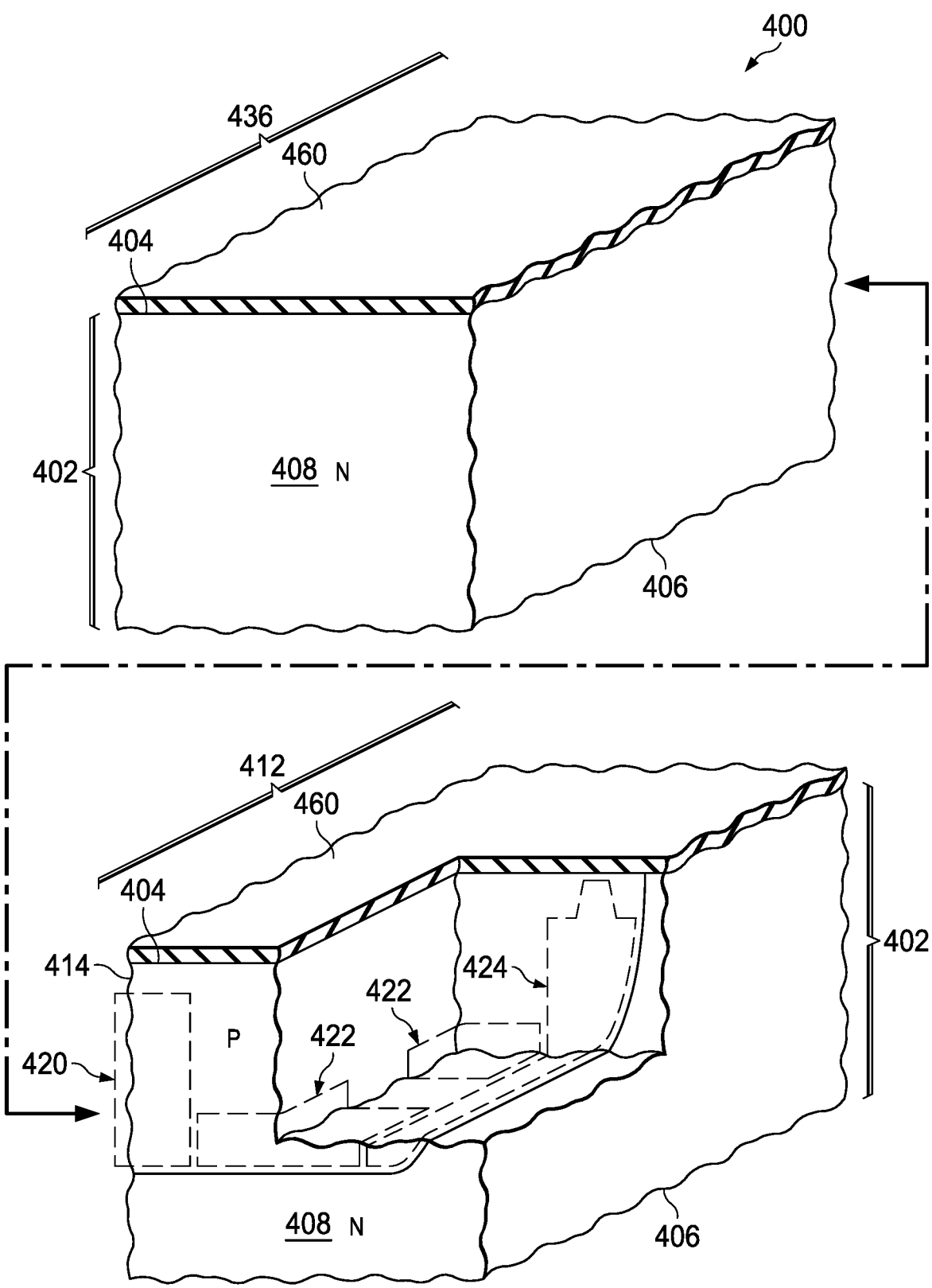

FIG. 4A through FIG. 4E are cross sections of a semiconductor device 400 including a BJT 412, depicted in stages of another example method of formation. Referring to FIG. 4A, the semiconductor device 400 is formed in and on a substrate 402 having a top surface 404. The substrate 402 includes a semiconductor material 406. In this example, the semiconductor material 406 may include a lower region 408 that is n-type, such as a buried layer or an epitaxial layer. The substrate 402 of this example includes an area for a BJT 412, implemented as a PNP BJT 412, and an area for a PMOS transistor 436.

A first protective layer 460 may be formed on the top surface 404 of the substrate 402. The first protective layer 460 may have a structure and composition similar to that disclosed in reference to the first protective layer 260 of FIG. 2A. A collector implant mask 462 is formed over the first protective layer 460, exposing the first protective layer 460 in an area for a collector 414, shown in FIG. 4B, of the BJT 412. Referring back to FIG. 4A, in this example, the collector implant mask 462 may cover the area for the PMOS transistor 436. The collector implant mask 462 of this example may include hard mask materials, and may be formed by a patterned etch process.

P-type dopants are implanted into the substrate 402 where exposed by the collector implant mask 462 to form a collector implanted region 466 in the semiconductor material 406. The p-type dopants may include boron, with a total dose of $1 \times 10^{12}$ cm$^{-2}$ to $1 \times 10^{13}$ cm$^{-2}$, and may be implanted at one or more implant energies up to 1 MeV. The collector implant mask 462 may be subsequently removed, using a plasma etch process or a wet etch Referring to FIG. 4B, the substrate 402 is heated by a first anneal process, which causes the implanted p-type dopants in the collector implanted region 466 of FIG. 4A to diffuse into the semiconductor material 406 and become activated, to form the collector 414 of the BJT 412. The first protective layer 460 may increase in thickness during the first anneal process. The collector 414 includes a current collection region 420, located in the semiconductor material 406, a constriction region 422 located in the semiconductor material 406 laterally adjacent to the current collection region 420, and a contact region 424 located in the semiconductor material 406 laterally adjacent to the constriction region 422 and located opposite from the current collection region 420. The collector 414 may have an average concentration of the p-type dopants of $1 \times 10^{16}$ cm$^{-3}$ to $1 \times 10^{17}$ cm$^{-3}$, by way of example. Concentrations of the p-type dopants in the current collection region 420, the constriction region 422, and the contact region 424 may be equal, notwithstanding decreasing concentration profiles around a boundary of the collector 414. A portion or all of the first protective layer 460 may optionally be removed after the first anneal process 468 is completed.

Figure 4C:
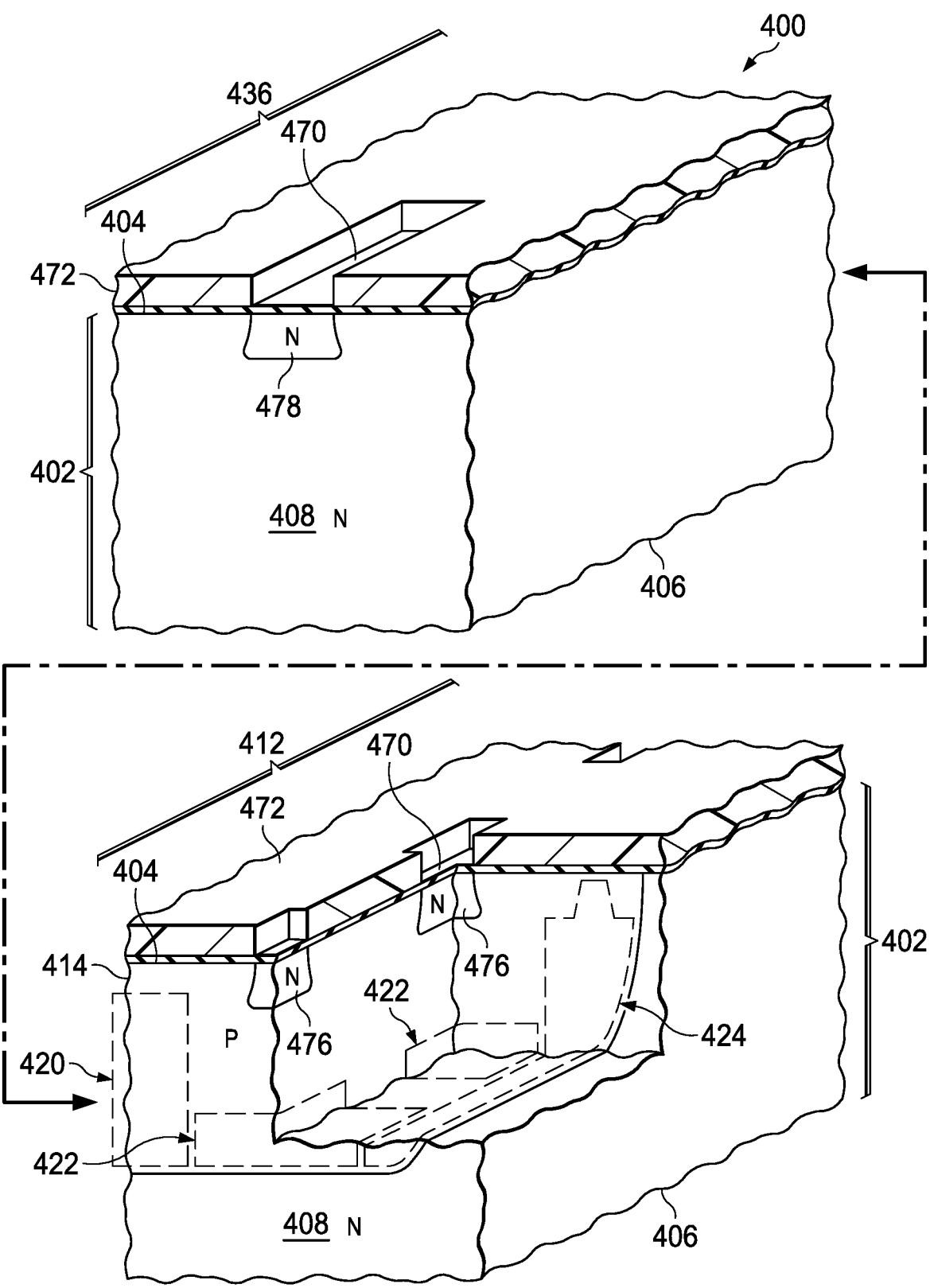

Referring to FIG. 4C, a second protective layer 470 may be formed on the top surface 404 of the substrate 402, similar to the first protective layer 460 of FIG. 4A. A well implant mask 472 is formed over the second protective layer 470, exposing the second protective layer 470 in an area for an n-type well 440, shown in FIG. 4D, and an area for a constricting well 428, also shown in FIG. 4D. The area for the n-type well 440 overlaps the area for the PMOS transistor 436, and the area for the constricting well 428 is located in the area for the BJT 412. In this example, the area for the constricting well 428 may be segmented, as depicted in FIG. 4C. The well implant mask 472 may include photoresist, and may be formed by a photolithographic process.

N-type dopants are implanted into the substrate 402 where exposed by the well implant mask 472 to form a first well implanted region 476 in the area for the BJT 412 and to form a second well implanted region 478 in the area for the PMOS transistor 436. The n-type dopants may include phosphorus and arsenic, with a total dose of $1 \times 10^{13}$ cm$^{-2}$ to $5 \times 10^{13}$ cm$^{-2}$, and may be implanted at one or more implant energies up to 2 MeV. The well implant mask 472 may be subsequently removed. Implanting the n-type dopants to concurrently form the first well implanted region 476 and the second well implanted region 478 may advantageously reduce a fabrication cost of the semiconductor device 400, as noted in reference to FIG. 2C. The first well implanted region 476 in the area for the BJT 412 may be segmented, due to the segmented configuration of the well implant mask 472 in the area for the BJT 412.

Figure 4D:
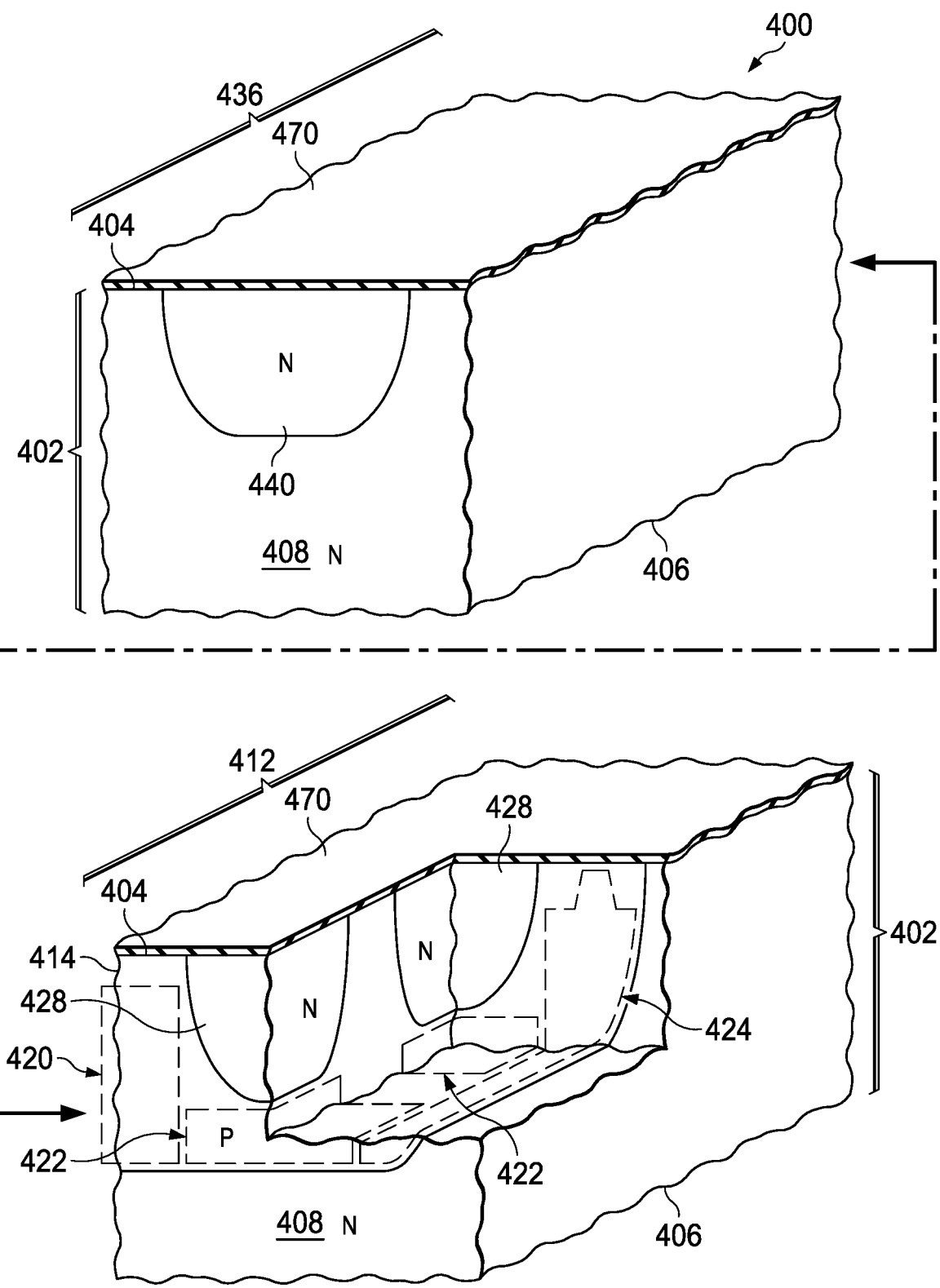
Figure 4E:
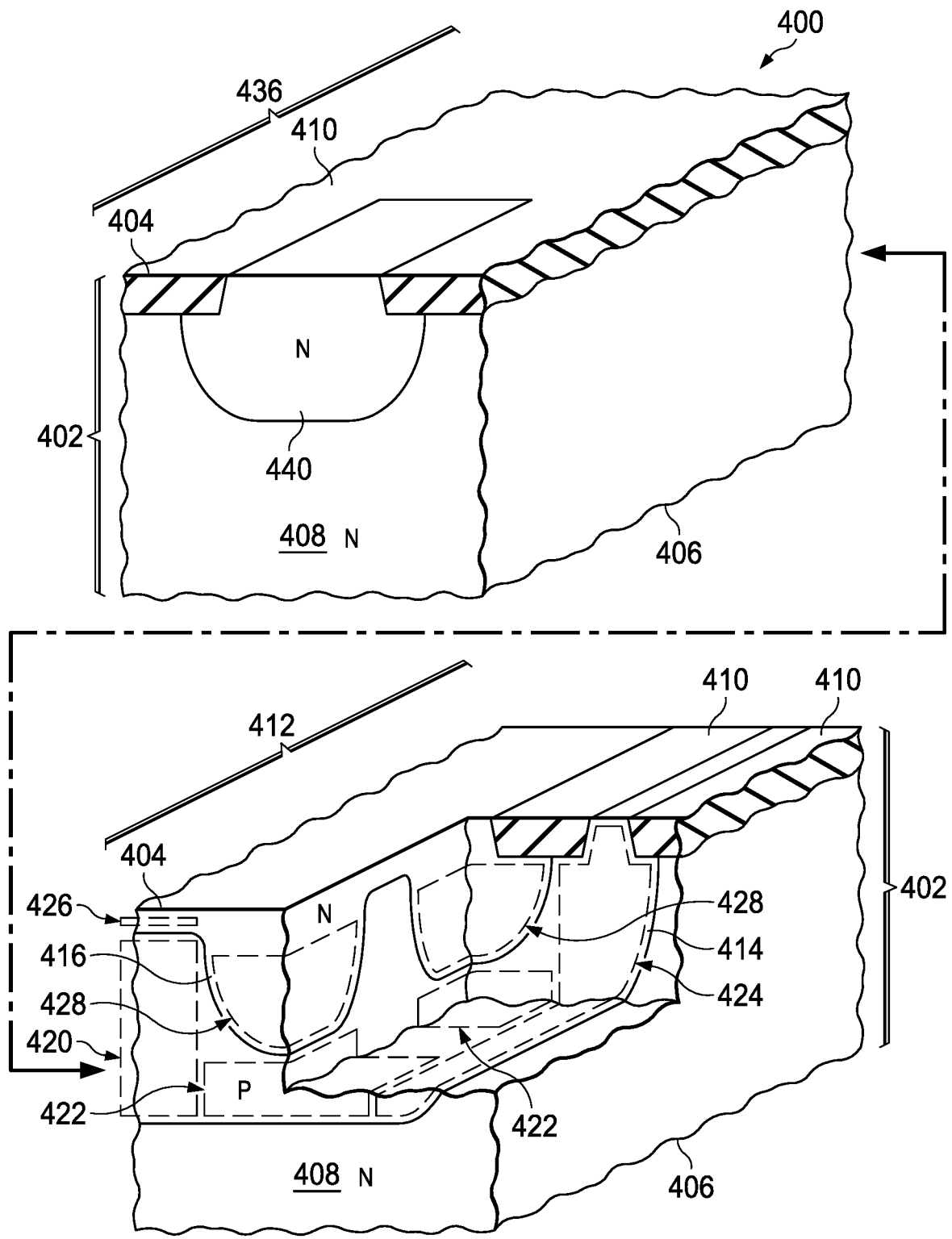

Referring to FIG. 4D, the substrate 402 is heated by a second anneal process, which causes the implanted n-type dopants in the first well implanted region 476 of FIG. 4C to diffuse into the semiconductor material 406 and become activated, to form the constricting well 428 of a base 416, shown in FIG. 4E, of the BJT 412, and which causes the implanted n-type dopants in the second well implanted region 478 of FIG. 4C to diffuse into the semiconductor material 406 and become activated, to form the n-type well 440 under the area for the PMOS transistor 436. In this example, the constricting well 428 is segmented, due to the segmented area for the constricting well 428 in the well implant mask 472 of FIG. 4C. The constricting well 428 and the n-type well 440 may have an average concentration of the n-type dopants of $5 \times 10^{16}$ cm$^{-3}$ to $3 \times 10^{17}$ cm$^{-3}$, by way of example. Average concentrations of the n-type dopants in the constricting well 428 and the n-type well 440 may be equal, as a result of being formed concurrently. Forming the constricting well 428 to have a segmented configuration as disclosed in this example may advantageously reduce fabrication cost and complexity for the semiconductor device 400 compared to using multiple implant masks and dopant implant operations.

Referring to FIG. 4E, field oxide 410 may be formed in the substrate 402 at the top surface 404. A current transmission region 426 of the base 416 of the BJT 412 is formed in the semiconductor material 406, laterally adjacent to, and contacting, the constricting well 428. The current transmission region 426 does not extend as far below the top surface 404 into the semiconductor material 406 as the constricting well 428. The current transmission region 426 may be formed by implanting n-type dopants into the semiconductor material 406, followed by an anneal process. An average dopant concentration of the n-type dopants in the current transmission region 426 may be different from the average dopant concentration of n-type dopants in the constricting well 428.

Figure 5:
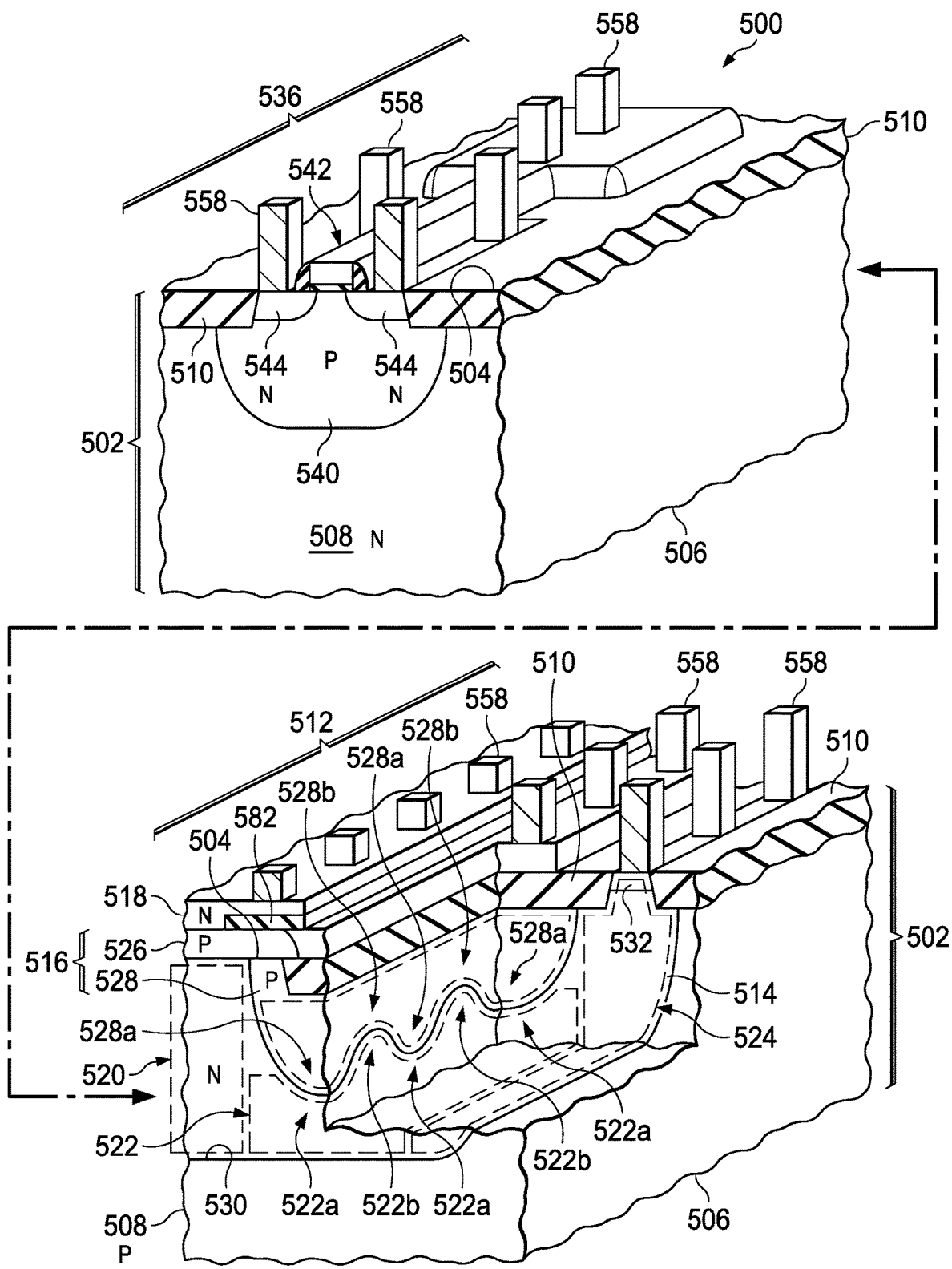
FIG. 5 is a cross section of a further example semiconductor device that includes a bipolar junction transistor.

FIG. 5 is a cross section of a further example semiconductor device 500 that includes a BJT 512. The semiconductor device 500 has a substrate 502 with a top surface 504. The substrate 502 includes a semiconductor material 506, which may include a lower region 508 that is p-type, in this example, as indicated in FIG. 5. The semiconductor device 500 may include field oxide 510 at the top surface 504 of the substrate 502.

In this example, the BJT 512 may be manifested as an NPN BJT. The BJT 512 includes a collector 514, which is n-type, a base 516, which is p-type, and an emitter 518, which is n-type. The collector 514 includes a current collection region 520, located in the semiconductor material 506, a constriction region 522, located in the semiconductor material 506 laterally adjacent to the current collection region 520, and a contact region 524 located in the semiconductor material 506 laterally adjacent to the constriction region 522 and located opposite from the current collection region 520. The base 516 includes a current transmission region 526 contacting the current collection region 520 of the collector 514, and a constricting well 528, located in the semiconductor material 506, laterally adjacent to the current transmission region 526. The emitter 518 is located on the current transmission region 526 of the base 516. In this example, the current transmission region 526 of the base 516 may be manifested as an epitaxial layer on the top surface 504 of the substrate 502. The emitter 518 may be manifested as a polysilicon emitter 518. The emitter 518 may be separated from the base 516 outside a portion of the current transmission region 526 located directly over the current collection region 520 by a spacer 582 of silicon dioxide or other electrically non-conductive material. In this example, the constricting well 528 has a striated configuration, that is, the constricting well 528 includes first constricting portions 528a alternating with second constricting portions 528b, as depicted in FIG. 5. The first constricting portions 528a may extend to greater depths in the semiconductor material 506, that is, may extend to greater vertical distances below the top surface 504, than the second constricting portions 528b. Also, the first constricting portions 528a may have greater average concentrations of p-type dopants than the second constricting portions 528b. The term "vertical" refers to directions perpendicular to the top surface 504. Correspondingly, the constriction region 522 of the collector 514 has first constriction portions 522a alternating with second constriction portions 522b. The first constriction portions 522a are located below, and in contact with, the first constricting portions 528a of the constricting well 528. The second constriction portions 522b are located below, and in contact with, the second constricting portions 528b of the constricting well 528. A bottom surface 530 of the collector 514 may be flat across the contact region 524, the constriction region 522, including the first constriction portions 522a and the second constriction portions 522b, and the current collection region 520. That is, the contact region 524, the constriction region 522, including the first constriction portions 522a and the second constriction portions 522b, and the current collection region 520 extend to a same depth in the semiconductor material 506 below the top surface 504.

The emitter 518, the current transmission region 526 of the base 516, and the current collection region 520 of the collector 514 may have dopant concentrations and distributions as disclosed in reference to FIG. 1, that provide a desired value of $h_{fe}$ for the BJT 512. Other dopant concentrations for the emitter 518, the current transmission region 526 of the base 516, and the current collection region 520 of the collector 514 are within the scope of this example. The contact region 524 of the collector 514 may have a dopant concentration similar to the dopant concentration of the current collection region 520. The constriction region 522 may have an average concentration and a distribution of dopants that provide a desired depletion region in the constriction region 522 when the collector 514 is biased into a linear mode of operation. The alternating configuration of the first constricting portions 528a and the second constricting portions 528b of the constricting well 528, and the corresponding alternating configuration of the first constriction portions 522a and the second constriction portions 522b of the constriction region 522, may advantageously provide a desired impedance between the current collection region 520 during operation of the BJT 512, thus providing a desired value for the $V_A$ of the BJT 512, while maintaining compatibility with implant doses for the constricting well 528 used in fabrication of the semiconductor device 500. The BJT 512 may also include contact layers 532 in the contact region 524 to provide low resistance electrical connections to the collector 514.

In this example, the semiconductor device 500 may include a first MOS transistor 536. In this example, the first MOS transistor 536 may be manifested as an NMOS transistor 536. The NMOS transistor 536 is located in a first well 540 in the semiconductor material 506 of the substrate 502. The first well 540 is separate from the constricting well 528. In this example, in which the first MOS transistor 536 is manifested as the NMOS transistor 536, the first well 540 is manifested as a p-type well 540. In this example, the p-type well 540 and the constricting well 528 may be formed concurrently, however, the p-type well 540 may have an average concentration of p-type dopants greater than the first constricting portions 528a of the constricting well 528, as a result of diffusion of the p-type dopants into the second constricting portions 528b of the constricting well 528. The NMOS transistor 536 includes an NMOS gate structure 542 on the top surface 504 of the substrate 502, and n-type source/drain regions 544 in the semiconductor material 506 adjacent to the NMOS gate structure 542.

The semiconductor device 500 may include contacts 558 extending through a dielectric layer, not shown in FIG. 5, to provide electrical connections to the BJT 512 and the NMOS transistor 536. The dielectric layer is not shown in FIG. 5 to avoid obscuring the structures of the BJT 512 and the NMOS transistor 536. The dielectric layer may have a structure and composition similar to the dielectric layer 156 of FIG. 1. The semiconductor device 500 may include interconnects and bond pads in an interconnect region, not shown in FIG. 5, above the contacts 558.

Figure 6A:
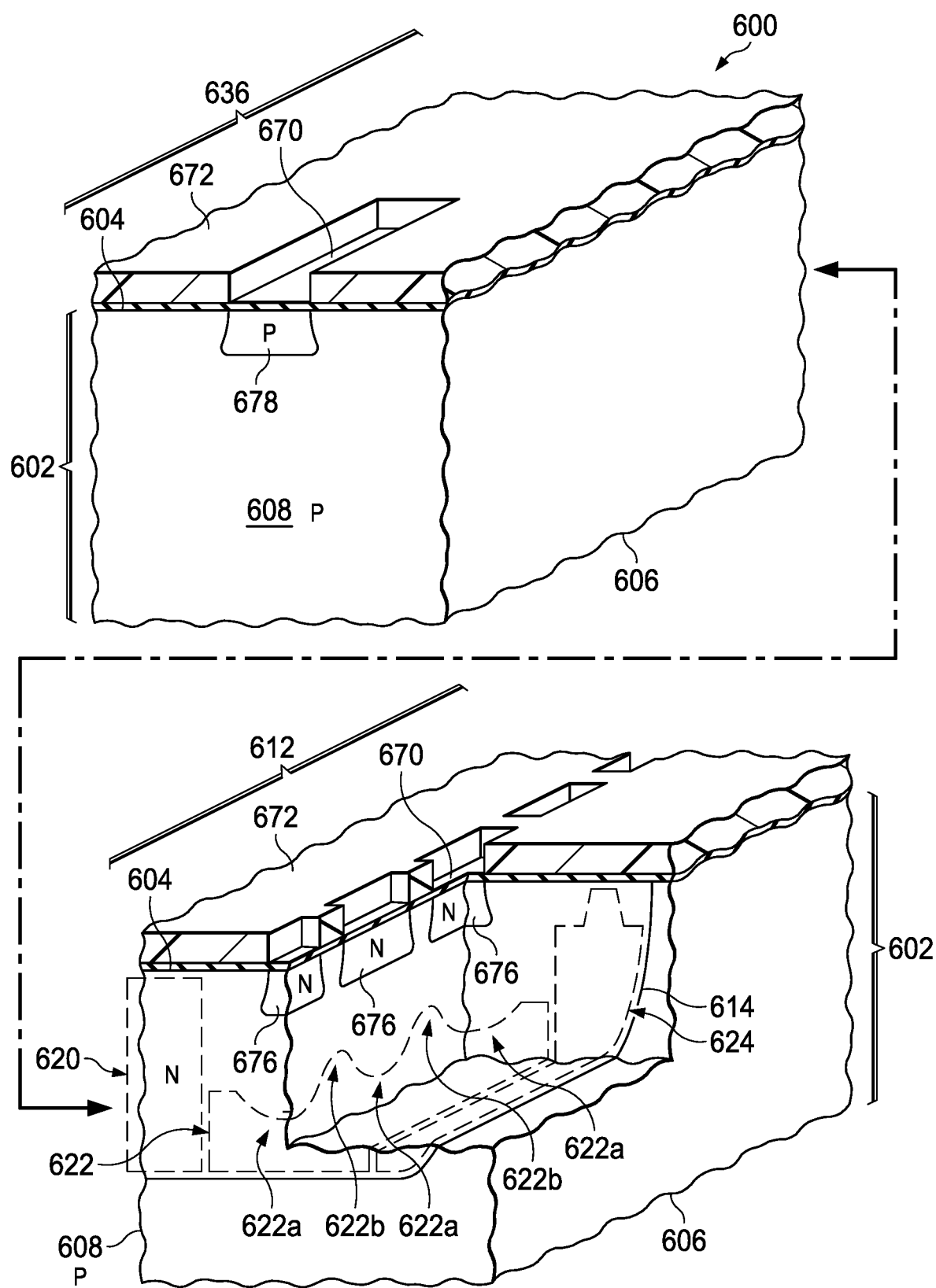
FIG. 6A through FIG. 6D are cross sections of a semiconductor device including a bipolar junction transistor, depicted in stages of a further example method of formation.

FIG. 6A through FIG. 6D are cross sections of a semiconductor device 600 including a BJT 612, depicted in stages of a further example method of formation. Referring to FIG. 6A, the semiconductor device 600 is formed in and on a substrate 602 having a top surface 604. The substrate 602 includes a semiconductor material 606. In this example, the semiconductor material 606 may include a lower region 608 that is p-type, such as a buried layer or an epitaxial layer. The substrate 602 of this example includes an area for a BJT 612, implemented as an NPN BJT 612, and an area for an NMOS transistor 636.

A collector 614 of the BJT 612 is formed in the semiconductor material 606. In this example, the collector 614 is n-type. The collector 614 may be formed by implanting n-type dopants, such as phosphorus, into the semiconductor material 606 and annealing the substrate 602 to diffuse and activate the n-type dopants. The collector 614 includes a current collection region 620, located in the semiconductor material 606, a constriction region 622 located in the semiconductor material 606 laterally adjacent to the current collection region 620, and a contact region 624 located in the semiconductor material 606 laterally adjacent to the constriction region 622 and located opposite from the current collection region 620. The collector 614 may have an average concentration of the p-type dopants of $1 \times 10^{16}$ cm$^{-3}$ to $1 \times 10^{17}$ cm$^{-3}$, by way of example. Concentrations of the p-type dopants in the current collection region 620, the constriction region 622, and the contact region 624 may be equal, notwithstanding decreasing concentration profiles around a boundary of the collector 614.

A protective layer 670 may be formed on the top surface 604 of the substrate 602, similar to the second protective layer 470 of FIG. 4C. A well implant mask 672 is formed over the protective layer 670, exposing the protective layer 670 in an area for a p-type well 640, shown in FIG. 6B, and an area for a constricting well 628, also shown in FIG. 6B, of a base 616 of the BJT 612. The area for the p-type well 640 overlaps the area for the NMOS transistor 636, and the area for the constricting well 628 is located in the area for the BJT 612. In this example, the area for the constricting well 628 may be segmented, as depicted in FIG. 6A. The well implant mask 672 may include photoresist, and may be formed by a photolithographic process.

P-type dopants are implanted into the substrate 602 where exposed by the well implant mask 672 to form a first well implanted region 676 in the area for the BJT 612 and to form a second well implanted region 678 in the area for the NMOS transistor 636. The p-type dopants may include boron, with a total dose of $1 \times 10^{13}$ cm$^{-2}$ to $5 \times 10^{13}$ cm$^{-2}$, and may be implanted at one or more implant energies up to 1 MeV. Implanting the p-type dopants to concurrently form the first well implanted region 676 and the second well implanted region 678 may advantageously reduce a fabrication cost of the semiconductor device 600, as noted in reference to FIG. 2C. The first well implanted region 676 in the area for the BJT 612 may be segmented, due to the segmented configuration of the well implant mask 672 in the area for the BJT 612. In this example, adjacent segments of the first well implanted region 676 are separated by distances less than lateral diffusion distances of the p-type dopants during a subsequent anneal process. After the p-type dopants are implanted, the well implant mask 672 may be subsequently removed.

Figure 6B:
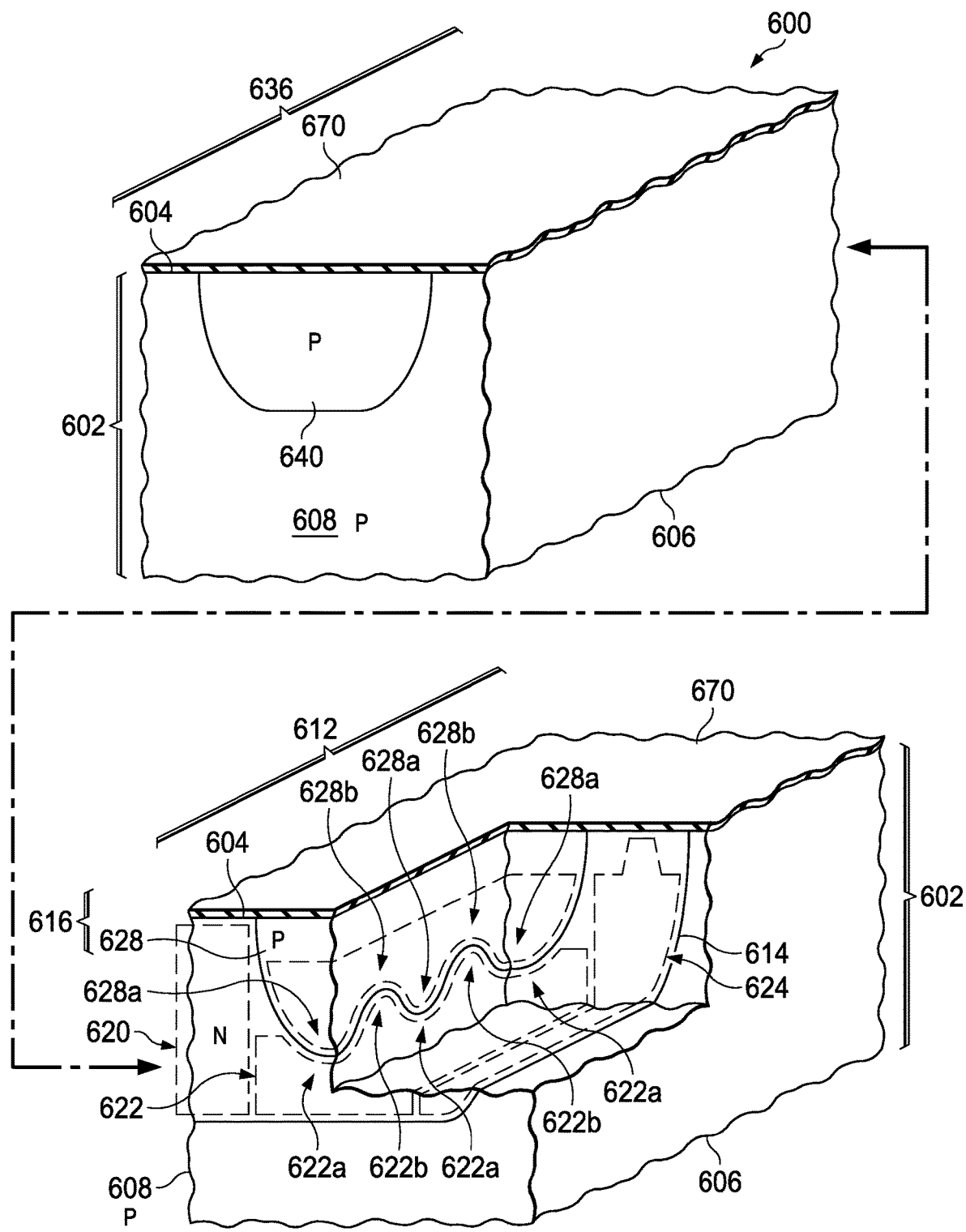

Referring to FIG. 6B, the substrate 602 is heated by an anneal process, which causes the implanted p-type dopants in the first well implanted region 676 of FIG. 6A to diffuse into the semiconductor material 606 and become activated, to form the constricting well 628 of the base 616, shown in FIG. 6E, of the BJT 612, and which causes the implanted p-type dopants in the second well implanted region 678 of FIG. 6A to diffuse into the semiconductor material 606 and become activated, to form the p-type well 640 under the area for the NMOS transistor 636. In this example, the constricting well 628 has the striated disclosed in reference to FIG. 5, in which the constricting well 628 includes first constricting portions 628a alternating with second constricting portions 628b, as depicted in FIG. 6B. The first constricting portions 628a correspond to the exposed areas of the well implant mask 672 of FIG. 6A. A concentration of the p-type dopants varies laterally along the constricting well 628, as disclosed in reference to FIG. 5. Forming the constricting well 628 to have a striated configuration as disclosed in this example may advantageously reduce fabrication cost and complexity for the semiconductor device 600 compared to using multiple implant masks and dopant implant operations.

Figure 6C:
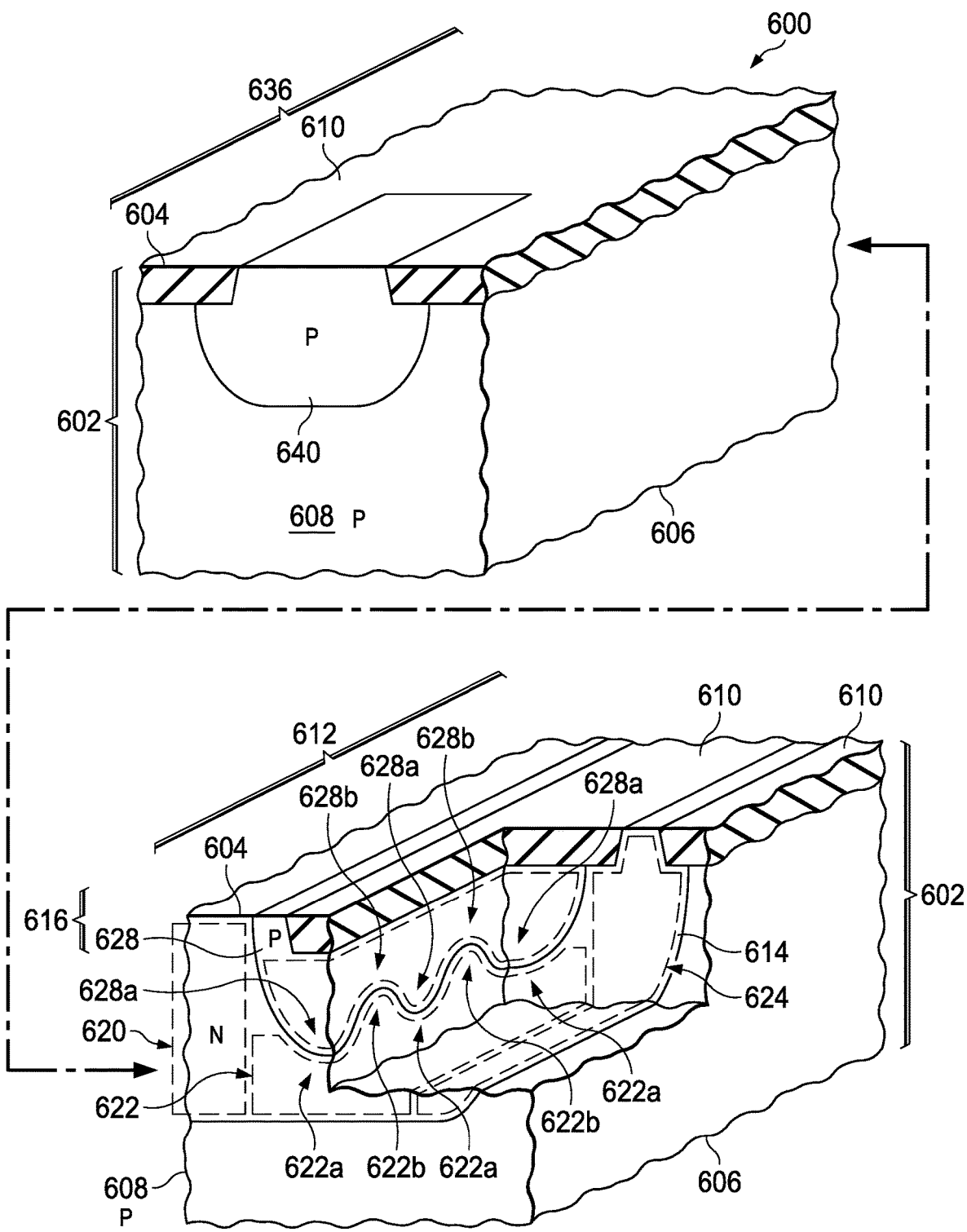

Referring to FIG. 6C, field oxide 610 may be formed in the substrate 602 at the top surface 604. The field oxide 610 may be formed by an STI process or by a LOCOS process, as disclosed in reference to FIG. 2C. Other methods of forming the field oxide 610 are within the scope of this example. In an alternate version of this example, the field oxide 610 may be formed prior to forming the constricting well 628 and the p-type well 640.

Figure 6D:
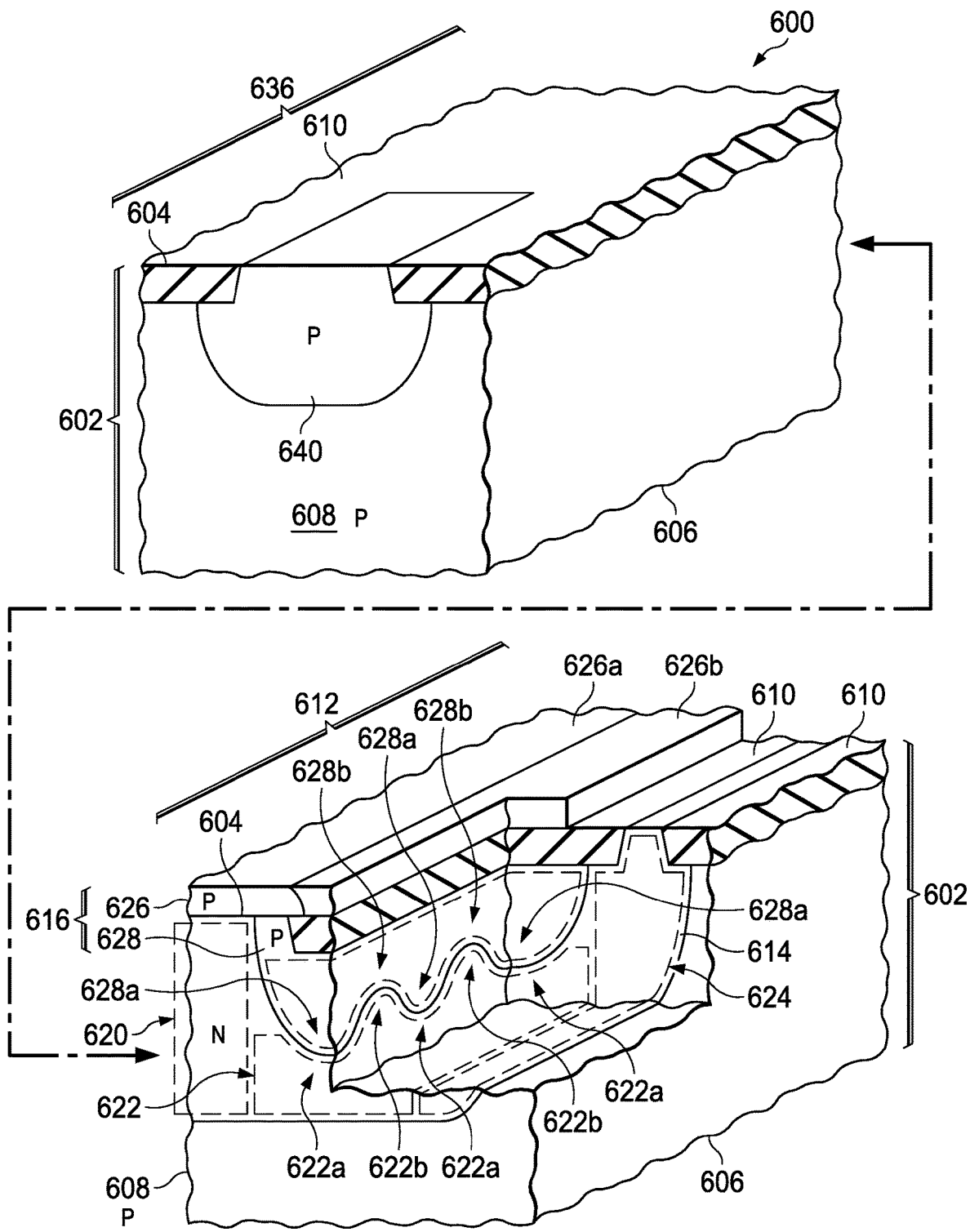

Referring to FIG. 6D, a current transmission region 626 of the base 616 of the BJT 612 is formed on the top surface 604 of the substrate 602, contacting the semiconductor material 606, by an epitaxial process. The current transmission region 626 contacts the constricting well 628. The current transmission region 626 may include a single crystal portion 626a contacting the semiconductor material 606, and a polycrystalline portion 626b contacting the field oxide 610, as a result of material growth characteristics of the epitaxial process. An average dopant concentration of the p-type dopants in the current transmission region 626 may be different from the average dopant concentration of p-type dopants in the constricting well 628.

Formation of the semiconductor device 600 is continued with formation of an emitter, similar to the emitter 518 of FIG. 5, and formation of the NMOS transistor 636. similar to the NMOS transistor 536 of FIG. 5.

Various features of the examples disclosed herein may be combined in other manifestations of example semiconductor devices. The BJT 112 of FIG. 1 and the BJT 212 of FIG. 2A through FIG. 2F may be manifested as a PNP BJT, rather than the disclosed NPN BJT. Similarly, the BJT 312 of FIG. 3 and the BJT 412 of FIG. 4A through FIG. 4E may be manifested as an NPN BJT, rather than the disclosed PNP BJT, and the BJT 512 of FIG. 5 and the BJT 612 of FIG. 6A through FIG. 6D may be manifested as a PNP BJT, rather than the disclosed NPN BJT.

The constricting well 128 of the BJT 112 of FIG. 1 may have a segmented configuration similar to the segmented constricting well 328 of FIG. 3, or may have a striated configuration similar to the striated constricting well 528 of FIG. 5. The segmented constricting well 328 of the BJT 312 of FIG. 3 may have a uniform configuration similar to the constricting well 128 of FIG. 1, or may have a striated configuration similar to the striated constricting well 528 of FIG. 5. The striated constricting well 528 of the BJT 512 of FIG. 5 may have a uniform configuration similar to the constricting well 128 of FIG. 1, or may have a segmented configuration similar to the segmented constricting well 328 of FIG. 3.

The well implant mask 272 used to form the constricting well 228 of the BJT 212 of FIG. 2A through FIG. 2F may have a segmented configuration similar to the well implant mask 472 of FIG. 4C or the well implant mask 672 of FIG. 6A. The well implant mask 472 used to form the constricting well 428 of the BJT 412 of FIG. 4A through FIG. 4E may have a uniform configuration similar to the well implant mask 272 of FIG. 2C or the segmented well implant mask 672 of FIG. 6A. The well implant mask 672 used to form the constricting well 628 of the BJT 612 of FIG. 6A through FIG. 6D may have a uniform configuration similar to the well implant mask 272 of FIG. 2C or the segmented well implant mask 472 of FIG. 4C.

The BJT 112 of FIG. 1 may have the current transmission region 126 of the base 116 located in the semiconductor material 106 and the emitter 118 located above the top surface 104, as disclosed in reference to the BJT 312 of FIG. 3, or may have the current transmission region 126 and the emitter 118 located above the top surface 104, as disclosed in reference to the BJT 512 of FIG. 5. The BJT 312 of FIG. 3 may have the current transmission region 326 of the base 316 and the emitter 318 located in the semiconductor material 306, as disclosed in reference to the BJT 112 of FIG. 1, or may have the current transmission region 326 and the emitter 318 located above the top surface 304, as disclosed in reference to the BJT 512 of FIG. 5. The BJT 512 of FIG. 5 may have the current transmission region 526 of the base 516 and the emitter 518 located in the semiconductor material 506, as disclosed in reference to the BJT 112 of FIG. 1, or may have the current transmission region 526 located in the semiconductor material 506 and the emitter 518 located above the top surface 504, as disclosed in reference to the BJT 312 of FIG. 3.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a semiconductor device, comprising:
   forming a collector of a bipolar junction transistor in a semiconductor material of a substrate, the collector having a first conductivity type, the collector including:
      a current collection region;
      a constriction region laterally adjacent to the current collection region; and
      a contact region laterally adjacent to the constriction region, located opposite from the current collection region, wherein the current collection region, the constriction region, and the contact region are formed concurrently;
   forming a base of the bipolar junction transistor, by a process including:
      forming a current transmission region of the base over the current collection region, the current transmission region having a second conductivity type, opposite from the first conductivity type; and
      forming a constricting well of the base in the semiconductor material between the constriction region and a top surface of the substrate, the constricting well adjacent to, and contacting, the current transmission region, the constricting well having the second conductivity type, wherein the constricting well extends deeper into the substrate from the top surface than the current transmission region; and
      forming an emitter over the current transmission region, the emitter having the first conductivity type.

2. The method of claim 1, wherein forming the constricting well further includes forming a well implant mask over the top surface, the well implant mask exposing the substrate in an area for the constricting well, and implanting dopants of the second conductivity type into the semiconductor material where exposed by the well implant mask.

3. The method of claim 2, wherein the well implant mask exposes the substrate in an area for a metal oxide semiconductor (MOS) transistor, and wherein the dopants of the second conductivity type are concurrently implanted into the semiconductor material in the area for the MOS transistor.

4. The method of claim 2, wherein the well implant mask has a segmented configuration over the constriction region.

5. The method of claim 1, wherein forming the collector includes implanting dopants of the first conductivity type into the semiconductor material concurrently in the current collection region, the constriction region, and the contact region.

6. The method of claim 1, wherein forming the collector is performed so that the current collection region, the constriction region, and the contact region extend to a same depth in the semiconductor material below the top surface.

7. The method of claim 1, wherein the first conductivity type is n-type and the second conductivity type is p-type.

8. The method of claim 1, wherein forming the current transmission region includes implanting dopants of the second conductivity type into the semiconductor material in an area for the current transmission region.

9. The method of claim 1, wherein forming the current transmission region includes forming an epitaxial layer on the semiconductor material over the top surface of the substrate.

10. A method of forming a semiconductor device, comprising:

forming a bipolar transistor in a semiconductor material of a substrate, including:
  forming a collector in the semiconductor material, the collector having a first conductivity type, the collector formed by:
    forming a current collection region;
    forming a constriction region laterally adjacent to the current collection region; and
    forming a contact region laterally adjacent to the constriction region, located opposite from the current collection region, wherein the current collection region, the constriction region, and the contact region are formed concurrently;
  forming a base of the bipolar junction transistor, by a process including:
    forming a current transmission region of the base over the current collection region, the current transmission region having a second conductivity type, opposite from the first conductivity type; and
    forming a constricting well of the base in the semiconductor material between the constriction region and a top surface of the substrate, the constricting well adjacent to, and contacting, the current transmission region, the constricting well having the second conductivity type, wherein the constricting well extends deeper into the substrate from the top surface than the current transmission region; and
  forming an emitter over the current transmission region, the emitter having the first conductivity type; and
forming a metal oxide semiconductor (MOS) transistor including forming a well region simultaneously with forming the constricting well.

11. The method of claim 10, wherein forming the constricting well further includes forming a well implant mask over the top surface, the well implant mask exposing the substrate in an area for the constricting well, and implanting dopants of the second conductivity type into the semiconductor material where exposed by the well implant mask.

12. The method of claim 11, wherein the well implant mask exposes the substrate in an area for the metal oxide semiconductor (MOS) transistor, and wherein the dopants of the second conductivity type are concurrently implanted into the semiconductor material in the area for the MOS transistor.

13. The method of claim 12, wherein the well implant mask has a segmented configuration over the constriction region.

14. The method of claim 10, wherein forming the collector includes implanting dopants of the first conductivity type into the semiconductor material concurrently in the current collection region, the constriction region, and the contact region.

15. The method of claim 10, wherein forming the collector is performed so that the current collection region, the constriction region, and the contact region extend to a same depth in the semiconductor material below the top surface.

16. The method of claim 10, wherein the first conductivity type is n-type and the second conductivity type is p-type.

17. The method of claim 10, wherein forming the current transmission region includes implanting dopants of the second conductivity type into the semiconductor material in an area for the current transmission region.

18. The method of claim 10, wherein forming the current transmission region includes forming an epitaxial layer on the semiconductor material over the top surface of the substrate.

* * * * *